(12) United States Patent
Cha et al.

(10) Patent No.: US 12,048,193 B2
(45) Date of Patent: Jul. 23, 2024

(54) DISPLAY DEVICE INCLUDING OPTICAL SHEET AND STRESS CONTROL MEMBER

(71) Applicant: Samsung Display Co., Ltd., Yongin-si (KR)

(72) Inventors: Hyunji Cha, Gwangju (KR); Wonkyu Kwak, Seongnam-si (KR); Young-Soo Yoon, Seoul (KR); Jae Yong Lee, Seongnam-si (KR); Yun-Kyeong In, Hwaseong-si (KR); Minhee Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/198,807

(22) Filed: May 17, 2023

(65) Prior Publication Data

US 2023/0292548 A1 Sep. 14, 2023

Related U.S. Application Data

(63) Continuation of application No. 16/813,517, filed on Mar. 9, 2020, now Pat. No. 11,758,764.

(30) Foreign Application Priority Data

May 30, 2019 (KR) .......................... 10-2019-0064038

(51) Int. Cl.
*H10K 50/86* (2023.01)
*G02B 5/30* (2006.01)
(Continued)

(52) U.S. Cl.
CPC ......... *H10K 50/868* (2023.02); *G02B 5/3083* (2013.01); *H10K 50/844* (2023.02);
(Continued)

(58) Field of Classification Search
CPC ...... H10K 50/868; H10K 50/85; H10K 50/00; H10K 50/844; H10K 59/50; H10K 59/65;
(Continued)

(56) References Cited

U.S. PATENT DOCUMENTS 9,614,168 B2    4/2017  Zhang et al.
10,126,781 B2   11/2018 Ahn et al.
(Continued)

FOREIGN PATENT DOCUMENTS

CN    105390068 A    3/2016
CN    106537485 A    3/2017
(Continued)

OTHER PUBLICATIONS

Non-Final Office Action issued Apr. 1, 2022, in U.S. Appl. No. 16/813,517.
(Continued)

*Primary Examiner* — Ida M Soward
(74) *Attorney, Agent, or Firm* — CANTOR COLBURN LLP

(57) ABSTRACT

A display device includes an electronic panel, a window, an optical sheet, and a stress control member. The electronic panel includes a first non-bending area having a first area overlapping the optical sheet and a second area overlapping at least part of the recessed area, a bending area configured to be bent relative to the first non-bending area, and a second non-bending area extending from the bending area and movable to a position opposing the first non-bending area. The optical sheet is disposed between the electronic panel and the window and having a recessed area defined therein extending toward a center of the optical sheet. The stress control member overlaps with at least a portion of the second area, at least a portion of the bending area, and at least a portion of the second non-bending area, respectively.

23 Claims, 17 Drawing Sheets

(51) Int. Cl.
  *G06F 1/16*     (2006.01)
  *G09F 9/30*     (2006.01)
  *H10K 50/00*    (2023.01)
  *H10K 50/80*    (2023.01)
  *H10K 50/84*    (2023.01)
  *H10K 50/844*   (2023.01)
  *H10K 50/85*    (2023.01)
  *H10K 59/12*    (2023.01)
  *H10K 59/13*    (2023.01)
  *H10K 59/50*    (2023.01)
  *H10K 59/65*    (2023.01)
  *G02F 1/1333*   (2006.01)
  *G02F 1/1335*   (2006.01)
  *H10K 77/10*    (2023.01)
  *H10K 102/00*   (2023.01)

(52) U.S. Cl.
  CPC ............ *H10K 59/50* (2023.02); *H10K 59/65* (2023.02); *G02F 1/133331* (2021.01); *G02F 1/133528* (2013.01); *H10K 77/111* (2023.02); *H10K 2102/311* (2023.02)

(58) Field of Classification Search
  CPC ...... H10K 59/131; H10K 59/40; H10K 59/12; H10K 59/00; H10K 77/111; H10K 2102/311; G02B 5/3083; G02B 5/3033; G02F 1/133331; G02F 1/133528; G02F 1/133308; G02F 1/13335; G06F 1/1652; G09F 9/301; G09F 9/33
  See application file for complete search history.

(56) References Cited

U.S. PATENT DOCUMENTS

| | | | |
|---|---|---|---|
| 10,177,129 B2 | 1/2019 | Namkung et al. | |
| 10,224,498 B2 | 3/2019 | Um et al. | |
| 10,367,043 B2 | 7/2019 | Yanagisawa et al. | |
| 10,462,896 B1 | 10/2019 | Kwon et al. | |
| 10,481,726 B2 | 11/2019 | Ahn | |
| 10,606,123 B2 | 3/2020 | Park et al. | |
| 10,908,340 B2 | 2/2021 | Namkung et al. | |
| 10,936,106 B2 | 3/2021 | Lee et al. | |
| 2016/0147361 A1* | 5/2016 | Ahn | G06F 3/041 345/173 |
| 2016/0219723 A1* | 7/2016 | Jung | H05K 1/147 |
| 2017/0352834 A1 | 12/2017 | Kim et al. | |
| 2018/0062618 A1 | 3/2018 | Nagarkar et al. | |
| 2018/0182820 A1 | 6/2018 | Kim | |
| 2018/0299603 A1 | 10/2018 | Lee et al. | |
| 2018/0337220 A1 | 11/2018 | Kim et al. | |
| 2019/0014669 A1 | 1/2019 | Ahn et al. | |
| 2019/0014671 A1 | 1/2019 | Ahn et al. | |
| 2019/0019855 A1 | 1/2019 | Park et al. | |
| 2019/0081274 A1 | 3/2019 | Choi et al. | |
| 2019/0165332 A1 | 5/2019 | Kwon et al. | |
| 2019/0339741 A1 | 11/2019 | Park | |
| 2019/0340959 A1 | 11/2019 | Park | |
| 2019/0355927 A1 | 11/2019 | Park | |
| 2019/0377447 A1 | 12/2019 | Lee et al. | |
| 2020/0057472 A1 | 2/2020 | Kang et al. | |
| 2021/0157367 A1* | 5/2021 | Wu | B32B 27/281 |
| 2021/0174111 A1 | 6/2021 | Im et al. | |
| 2021/0184162 A1 | 6/2021 | Park | |
| 2021/0280093 A1 | 9/2021 | Zhu | |
| 2022/0093015 A1 | 3/2022 | Park | |
| 2022/0246886 A1* | 8/2022 | Choi | H10K 59/12 |
| 2024/0072061 A1* | 2/2024 | Miyaguchi | H01L 23/562 |

FOREIGN PATENT DOCUMENTS

| | | | | |
|---|---|---|---|---|
| CN | 107564918 A | 1/2018 | | |
| CN | 107887338 A | 4/2018 | | |
| CN | 108732673 A | 11/2018 | | |
| CN | 109215501 A | 1/2019 | | |
| CN | 109218471 A | 1/2019 | | |
| CN | 109426035 A | 3/2019 | | |
| CN | 109743426 A | 5/2019 | | |
| EP | 3293606 A1 * | 3/2018 | ........... | G06F 1/1637 |
| KR | 10-2018-0073762 | 7/2018 | | |
| KR | 10-2018-0116785 | 10/2018 | | |
| KR | 1020190045897 A | 5/2019 | | |

OTHER PUBLICATIONS

Non-Final Office Action issued Sep. 9, 2022, in U.S. Appl. No. 16/813,517.

Notice of Allowance issued Feb. 15, 2023, in U.S. Appl. No. 16/813,517.

Office Action mailed Mar. 20, 2024 in corresponding Chinese Application No. CN202010434557,6, 14 pages.

* cited by examiner

DISPLAY DEVICE INCLUDING OPTICAL SHEET AND STRESS CONTROL MEMBER

CROSS-REFERENCE TO RELATED APPLICATION

This application is a Continuation of U.S. patent application Ser. No. 16/813,517 filed on Mar. 9, 2020, which claims priority from and the benefit of Korean Patent Application No. 10-2019-0064038, filed on May 30, 2019, each of which is hereby incorporated by reference for all purposes as if fully set forth herein.

BACKGROUND

Field

Embodiments of the invention relate generally to a display device and more specifically, to a display device having an optical sheet.

Discussion of the Background

A display device is part of electronic devices for various mobile devices, such as a smartphone, a digital camera, a camcorder, a portable terminal, a laptop computer, and a tablet personal computer. Since the display device provides the user with the most familiar and clear visual information, most electronic devices include a display device The electronic device is manufactured by assembling the display device and electronic modules. An electronic device having a slim bezel is desirable for portability and to provide a wide display area. Accordingly, many implementations of the display device and the electronic modules have a slim bezel. As an example, the display device can be partially bent, and the display device and the electronic modules are coupled to each other in an area in or near where bending of the display device occurs.

The above information disclosed in this Background section is only for understanding of the background of the inventive concepts, and, therefore, it may contain information that does not constitute prior art.

SUMMARY

Applicant realized that stresses caused by bending of a display device in the area where the display device and the electronic modules (e.g., control module, camera module, etc) are coupled to each other can adversely affect the performance and/or reliability of the display device.

Display devices constructed according to the principles and embodiments of the invention are capable of reducing stress and defects in a bendable display panel, e.g., by disposing a stress control member in the bending area.

In addition, display devices constructed according to the principles and illustrative embodiments of the invention are capable of reducing the size of the non-display area such as the bezel area, e.g., by using an optical sheet having a recessed area that does not overlap the stress control member. The optical sheet may be arranged relative to a sealing gasket pattern to reduce the gap around the gasket pattern, thereby reducing defects in the display device caused by contaminants such as water.

Additional features of the inventive concepts will be set forth in the description which follows, and in part will be apparent from the description, or may be learned by practice of the inventive concepts.

According to one aspect of the invention, a display device includes: an electronic panel, a window attached to the electronic panel, an optical sheet disposed between the electronic panel and the window having a recessed area defined therein extending toward a center of the optical sheet, and a stress control member coupled to the electronic panel. The electronic panel includes a first non-bending area having a first area overlapping the optical sheet and a second area overlapping at least part of the recessed area, a bending area configured to be bent relative to the first non-bending area, and a second non-bending area extending from the bending area and opposing the first non-bending area. The stress control member overlaps with at least a portion of the second area, at least a portion of the bending area, and at least a portion of the second non-bending area, respectively.

The optical sheet may have a first edge aligned with an edge of the first area and a second edge not aligned with the edge of the second area. The recessed area may have a width greater than a width of the stress control member in a first direction substantially parallel to a bending axis of the bending area. The recessed area may have a width greater than a width of the bending area in a first direction substantially parallel to a bending axis of the bending area.

The display device may further include a gasket pattern coupled to at least a portion of the first edge of the optical sheet and at least a portion of the edge of the first area. The portion of the first edge of the optical sheet and the portion of the edge of the first area may be aligned with each other when viewed in a plan view. The gasket pattern may be coupled to at least a portion of a lower surface of the window, that does not overlap with the optical sheet and the electronic panel.

The stress control member may include a stress control layer that overlaps the second area and has a length of about 0.36 mm in a second direction extending to the bending area from the first non-bending area.

The display device may further include a first protective film overlapping with the first non-bending area and being disposed under the electronic panel and a second protective film overlapping with the second non-bending area, being disposed under the electronic panel, and opposing the first protective film. The first protective film may have an edge not aligned with the edge of the optical sheet, which corresponds to the edge of the recessed area.

The electronic panel further may include a display panel and an input sensor directly disposed on an upper surface of the display panel. The display device further includes a driving control module connected to the second non-bending area to control electronic components included in the electronic panel.

The optical sheet may include a polarizer and a retarder.

According to another aspect of the invention, a display device includes: a display panel, an optical sheet, a stress control member, and a window. The display panel includes a first non-bending area, a bending area extending from the first non-bending area, and a second non-bending area extending from the bending area and opposing the first non-bending area. The optical sheet is disposed on the display panel in a position overlapping a first area of the first non-bending area, and does not overlap a second area of the first non-bending area. The stress control member is disposed on the display panel and overlaps with at least a portion of the second area of the first non-bending area, at least a portion of the bending area, and at least a portion of the second non-bending area. The window is disposed on the optical sheet. The second area has a maximum width which is smaller than a width of the first non-bending area and greater than a width of the stress control member in a first direction substantially parallel to a bending axis of the bending area.

The optical sheet may have a first edge aligned with an edge of the first area and a second edge not aligned with the edge of the second area.

The display device may further include a gasket pattern covering at least a portion of an edge of the first area and at least a portion of the first edge of the optical sheet. The stress control member may include a stress control layer and the gasket pattern is disposed adjacent to the stress control layer in the first direction. The edge of the optical sheet may include a first surface contacting with the gasket pattern, a second surface extending from the first surface and opposing the stress control layer in the first direction, and a third surface extending from the second surface and opposing the stress control layer in a second direction extending from the first non-bending area to the bending area.

According to still another aspect of the invention, a display device includes: a display panel, an optical sheet, a stress control member, and a window. The display panel includes a first non-bending area, a bending area extending from the first non-bending area, and a second non-bending area extending from the bending area and opposing the first non-bending area. The optical sheet is disposed on the display panel, overlaps with a first area of the first non-bending area, and does not overlap with a second area of the first non-bending area. The stress control member is disposed on the display panel and overlaps with the second area of the first non-bending area, the bending area, and the second non-bending area, respectively. The window is disposed on the optical sheet. The optical sheet has a first edge aligned with an edge of the first area and a second edge not aligned with the edge of the second area.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
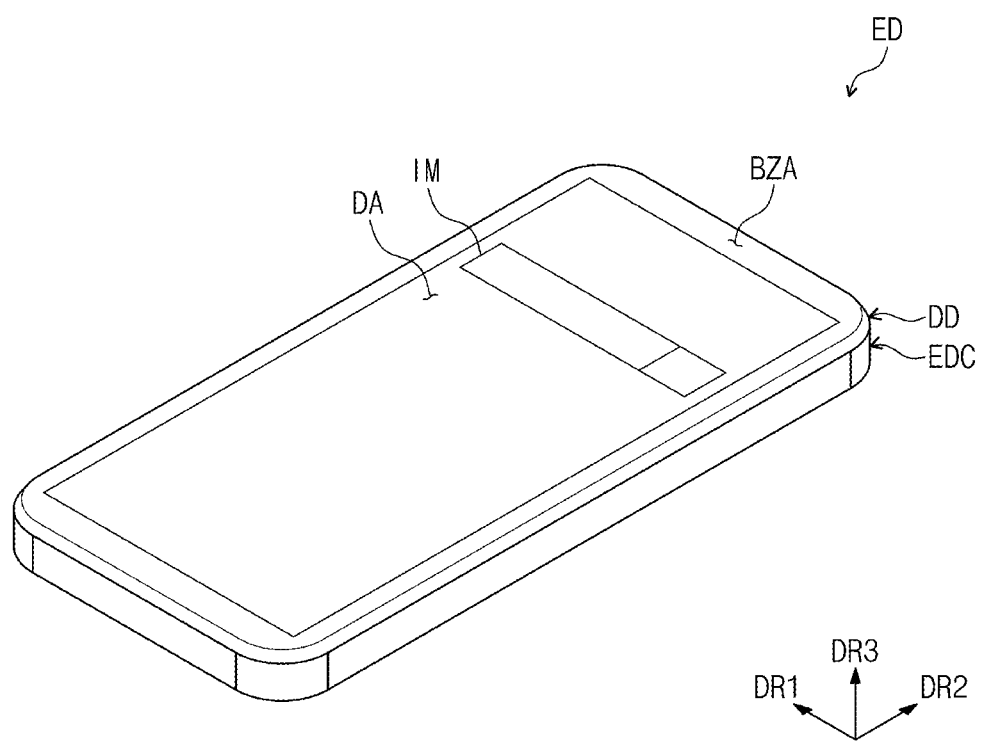
FIG. 1A is a perspective view of an illustrative embodiment of an electronic device constructed according to the principles of the invention.

In the following description, for the purposes of explanation, numerous specific details are set forth in order to provide a thorough understanding of various illustrative embodiments or implementations of the invention. As used herein "embodiments" and "implementations" are interchangeable words that are non-limiting examples of devices or methods employing one or more of the inventive concepts disclosed herein. It is apparent, however, that various illustrative embodiments may be practiced without these specific details or with one or more equivalent arrangements. In other instances, well-known structures and devices are shown in block diagram form in order to avoid unnecessarily obscuring various illustrative embodiments. Further, various illustrative embodiments may be different, but do not have to be exclusive. For example, specific shapes, configurations, and characteristics of an illustrative embodiment may be used or implemented in another illustrative embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an illustrative embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various illustrative embodiments are described herein with reference to sectional and/or exploded illustrations that are schematic illustrations of idealized illustrative embodiments and/or intermediate structures. As such, variations from the shapes of the illustrations as a result, for example, of manufacturing techniques and/or tolerances, are to be expected. Thus, illustrative embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
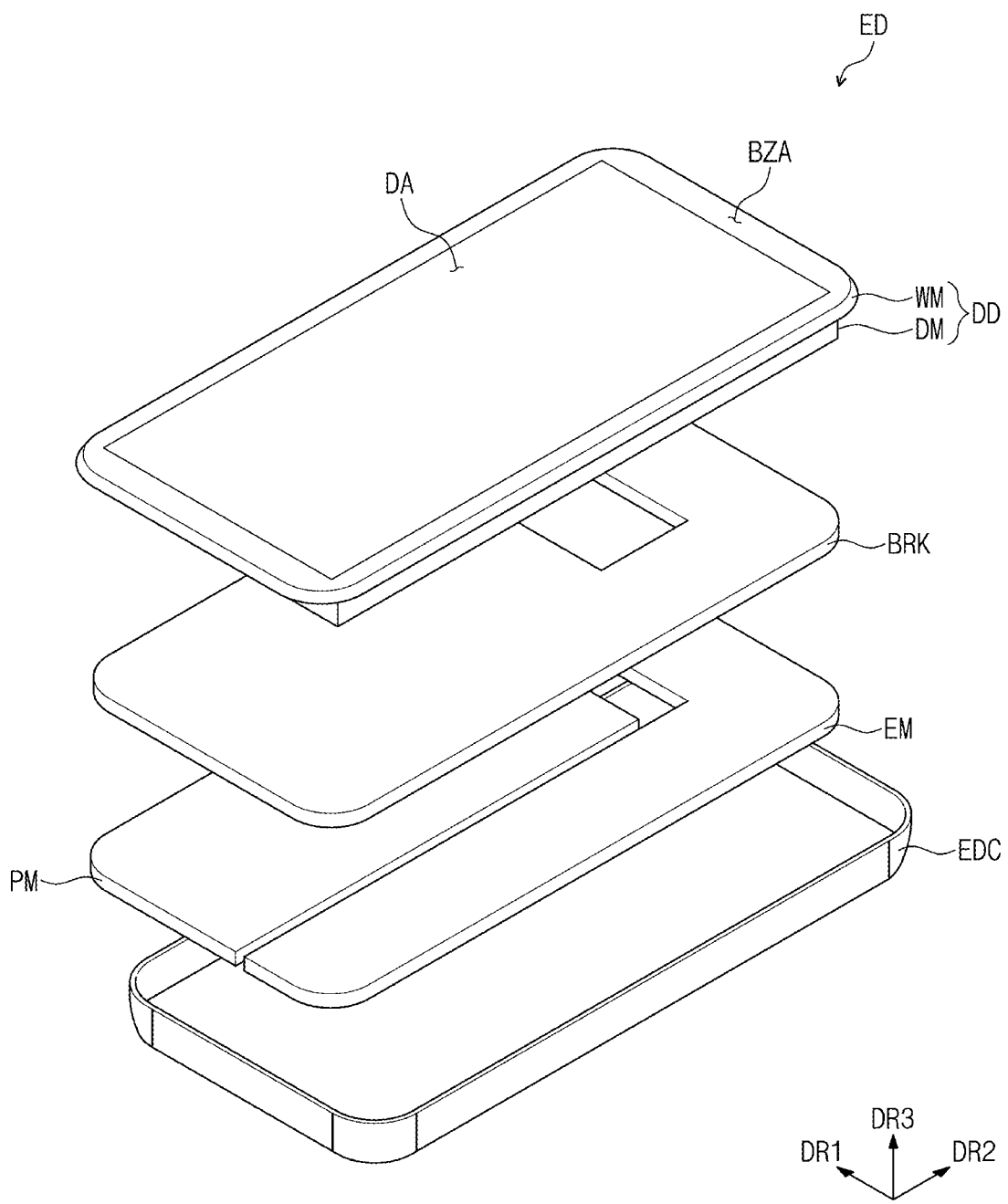
FIG. 1B is an exploded perspective view of the electronic device of FIG. 1A.

FIG. 1A is a perspective view of an illustrative embodiment of an electronic device ED constructed according to the principles of the invention. FIG. 1B is an exploded perspective view of an illustrative embodiment of the electronic device ED constructed according to the principles of the invention.

In illustrative embodiments, a smartphone is shown as a representative example of the electronic device ED, however, the illustrative embodiments should not be limited thereto or thereby. In the illustrative embodiment, the electronic device ED may be a tablet personal computer, a notebook computer, or a smart television.

Referring to FIGS. 1A and 1B, a display surface through which an image IM is displayed is a substantially parallel to a surface defined by a first directional axis DR1 and a second directional axis DR2. The display surface includes a display area DA and a bezel area BZA defined adjacent to the display area DA. As an example, the display area DA may have a generally quadrangular shape, but it should not be limited thereto or thereby. The bezel area BZA may surround the display area DA. In other words, the bezel area BZA may correspond to an edge of the display surface. However, according to other embodiments, the bezel area BZA may be defined only in two portions facing each other in the first directional axis DR1 or only in two portions facing each other in the second directional axis DR2.

A third directional axis DR3 indicates a normal line direction of the display surface, i.e., a thickness direction of the electronic device ED. Front (or upper, or first) and rear (or lower, or second) surfaces of each member are defined with respect to a direction in which the image IM is displayed. However, directions indicated by the first, second, and third directional axes DR1, DR2, and DR3 may be relative to each other and may be changed to other directions. Hereinafter, first, second, and third directions respectively correspond to directions indicated by the first, second, and third directional axes DR1, DR2, and DR3 and are assigned with the same reference numerals as the first, second, and third directional axes DR1, DR2, and DR3.

As shown in FIGS. 1A and 1B, the electronic device ED includes a display device DD, an electronic module EM, a power supply module PM, a bracket BRK, and an external case EDC. For the convenience of explanation, the components are schematically shown in FIGS. 1A and 1B.

The display device DD includes a window WM and a display module DM. The window WM provides a front surface of the electronic device ED. The display module DM is disposed on a lower surface of the window WM to generate an image. In addition, the display module DM may sense a user input, e.g., a user's touch and/or a user's pressure. The display module DM may be electrically connected to the electronic module EM via a flexible circuit board or an electronic component connector.

In the illustrated embodiment, the display module DM is shown with a flat display surface as a representative example, however, the shape of the display module DM may be modified. As an example, he display module DM may be bent to provide a curved surface.

The power supply module PM supplies the power necessary for an overall operation of the electronic device ED. The power supply module PM may include a conventional battery module.

The bracket BRK is coupled to the display device DD and/or the external case EDC to divide an inner space of the electronic device ED. The bracket BRK provides space in which other components are arranged. In addition, the bracket BRK may support the display device DD such that the display device DD is supported without shaking. The bracket BRK may be provided with a coupling groove defined therein and corresponding to the shape of the electronic module EM to allow the electronic module EM to be fixed to the bracket BRK. The bracket BRK includes a metal member and/or a plastic member. In the illustrated embodiment, one bracket BRK is shown as a representative example, however, the electronic device ED may include a plurality of brackets BRK.

The external case EDC may be coupled to the bracket BRK and/or the display device DD. The external case EDC provides an external surface of the electronic device ED. In the illustrated embodiment, the external case EDC is shown formed in an integral body as a representative example, however, the external case EDC may include plural bodies assembled with each other. The external case EDC may include a plurality of frames and/or a plurality of plates, which are formed of a glass, plastic, or metal material.

The electronic module EM includes a mother board and a variety of functional modules mounted on the mother board to operate the electronic device ED. The mother board may be electrically connected to the display device DD via a conventional electronic component connector. In the illustrated embodiment, the mother board may include a rigid circuit board.

Figure 2:
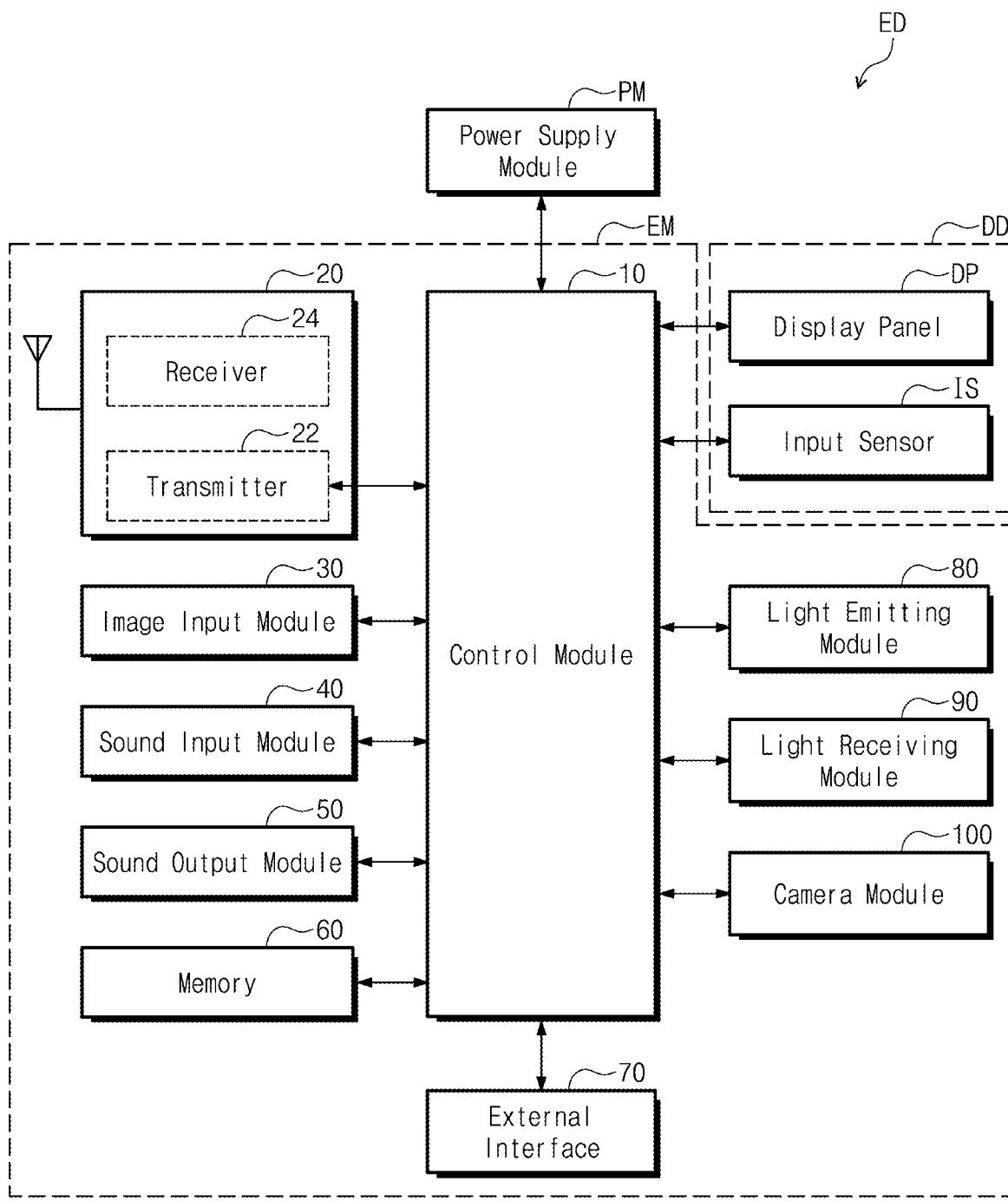
FIG. 2 is a block diagram of an illustrative embodiment of an electronic device constructed according to the principles of the invention.

FIG. 2 is a block diagram of an illustrative embodiment of the electronic device ED constructed according to the principles of the invention. Referring to FIG. 2, the electronic module EM may include a control module 10, a wireless communication module 20, an image input module 30, a sound input module 40, a sound output module 50, a memory 60, an external interface 70, a light emitting module 80, a light receiving module 90, and a camera module 100. Some of the modules may be electrically connected to the mother board via a flexible circuit board or a connector without being mounted on the mother board.

The control module 10 controls the overall operation of the electronic device ED. The control module 10 may be, but is not limited to, a microprocessor. For example, the control module 10 activates or deactivates the display device DD. The control module 10 controls the image input module 30, the sound input module 40, and the sound output module 50 based on the user's input signal provided from the display device DD.

The wireless communication module 20 may transmit/receive a wireless signal to/from other terminals using a Bluetooth or WiFi link. The wireless communication module 20 may transmit/receive a voice signal using a general communication line. The wireless communication module 20 may include a transmitter 22 that modulates a signal to be transmitted and transmits the modulated signal and a receiver 24 that demodulates the signal applied thereto.

The image input module 30 processes an image signal and converts the image signal into image data that may be displayed through the display device DD. The sound input module 40 receives an external sound signal through a microphone in a record mode or a voice recognition mode and converts the external sound signal to electrical voice data. The sound output module 50 converts the sound data provided from the wireless communication module 20 or the sound data stored in the memory 60 and outputs the converted sound data to the outside.

The external interface 70 serves as an interface between the control module 10 and external devices, such as an external charger, a wired/wireless data port, a card socket (e.g., a memory card and a SIM/UIM card), etc.

The light emitting module 80 generates and outputs light. The light emitting module 80 may emit infrared ray beams. The light emitting module 80 may include an LED element. The light receiving module 90 may sense the infrared ray beams. The light receiving module 90 may be activated when an infrared ray beam having a predetermined level or higher is sensed. The light receiving module 90 may include a complementary metal oxide semiconductor (CMOS). The infrared ray beam generated by and output from the light emitting module 80 may be reflected by an external object, e.g., a user's finger or face, and the reflected infrared ray beam may be incident upon the light receiving module 90. The light emitting module 80 and the light receiving module 90 may be provided in a plural number depending on use. The camera module 100 takes an image of an external object. The camera module 100 may be provided in a plural number depending on the use and position of the camera module 100 mounted on the electronic device ED.

As shown in FIG. 2, the display device DD may include a display panel DP and an input sensor IS. The display panel DP may generate the image IM of FIG. 1A. The input sensor IS may sense the user input.

Figure 3A:
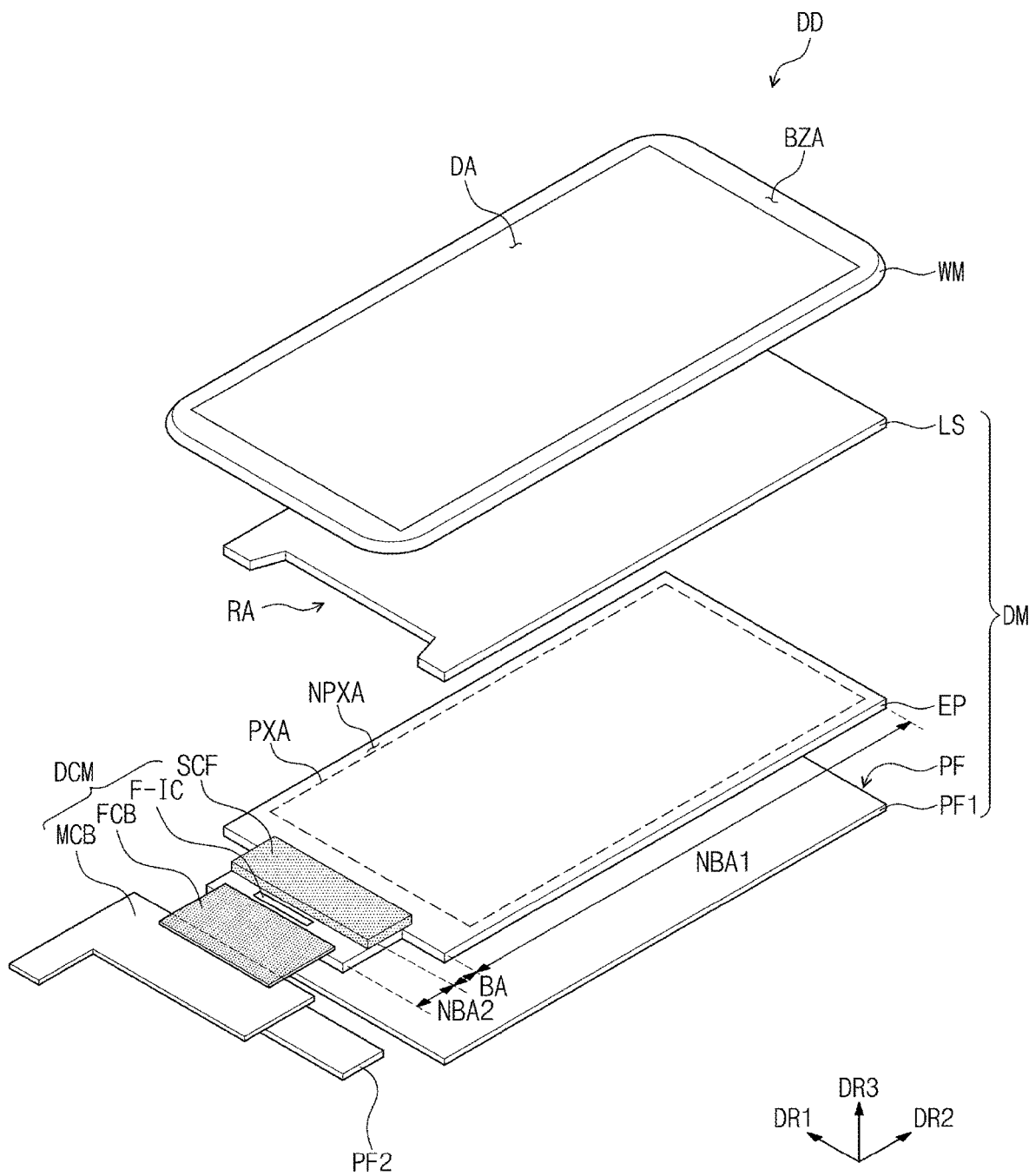
FIG. 3A is an exploded perspective view of an illustrative embodiment of a display device constructed according to the principles of the invention.

FIG. 3A is an exploded perspective view of an illustrative embodiment of the display device DD according to the principles of the invention. Referring to FIG. 3A, the display device DD may include the window WM and the display module DM.

The window WM may include a base layer and a bezel pattern disposed on a lower surface of the base layer. An area in which the bezel pattern is disposed is defined as the bezel area BZA shown in FIG. 3A. In FIG. 3A, the window WM has a flat shape in the display area DA, however, the shape of the window WM may be modified. Edges of the window WM, which face each other in the first direction DR1, may provide a curved surface.

The display module DM may include an optical sheet LS, an electronic panel EP, a protective film PF, a driving control module DCM, and a stress control member, which may be in the form of a stress control layer SCF. An adhesive member may be disposed between the optical sheet LS and the electronic panel EP and between the electronic panel EP and the protective film PF. The adhesive member may include a conventional adhesive that is a sheet type adhesive or a resin type adhesive. The adhesive member may be a pressure sensitive adhesive (PSA) film, an optically clear adhesive (OCA) film, or an optically clear resin (OCR).

The optical sheet LS may include a polarizer and a retarder. The polarizer and the retarder may include a stretching-type polarization film and a stretching-type retardation film. The number of the retarders and a retardation length ($\lambda/4$ or $\lambda/2$) of the retarder may be determined depending on the operating principle of the optical sheet LS. As an example, the polarizer and the retarder may be a coating-type polarization film and a coating-type retardation film, respectively, obtained by coating/orienting liquid crystal composition on a base film. The optical sheet LS may reduce a reflectivity of the display module DM.

The optical sheet LS may be provided with a recessed area RA defining a space in which the stress control layer SCF is disposed. The stress control layer SCF described later may be provided to reduce the stress caused by bending the display panel DP. Because the stress control layer SCF is provided, the recessed area RA may be defined in the optical sheet LS without increasing the length in the second direction DR2 of the bezel area BZA. Detailed descriptions of the shape of the optical sheet LS will be described later.

Figure 3B:
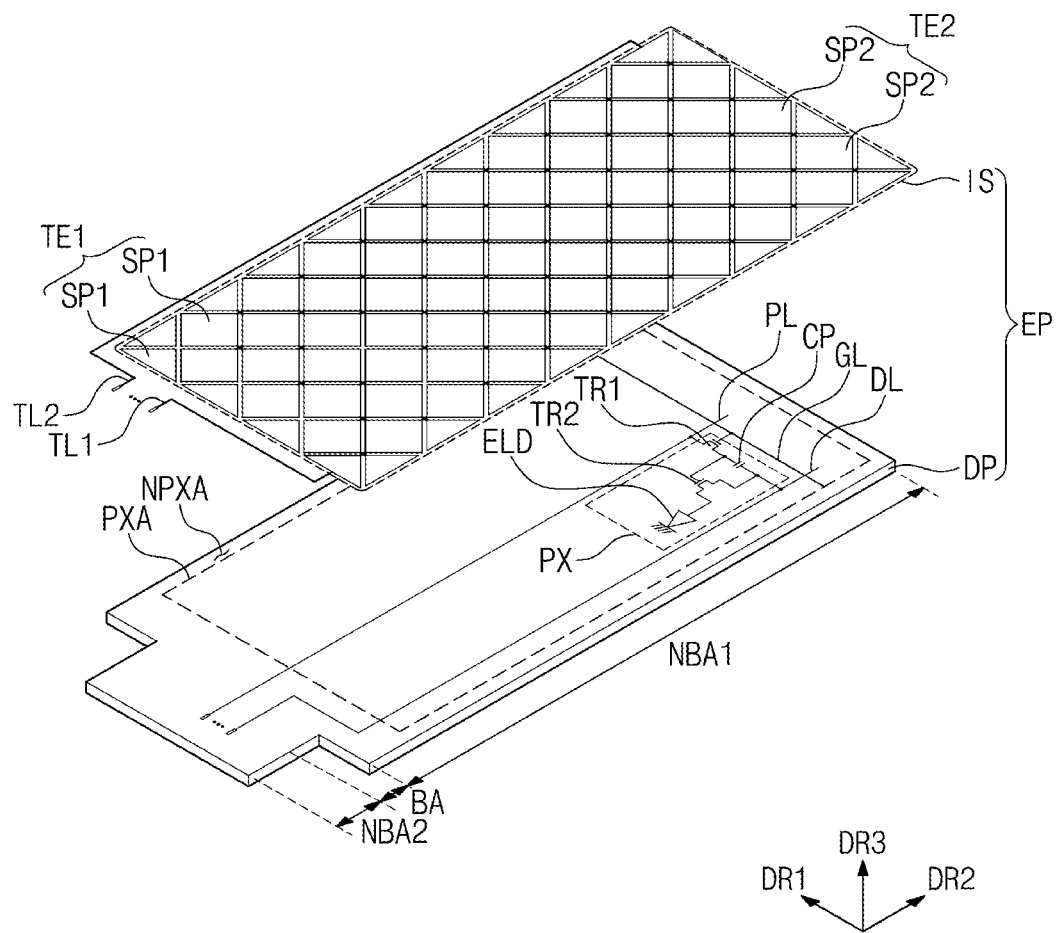
FIG. 3B is an exploded perspective view of an illustrative embodiment of the electronic panel shown in FIG. 3A.

FIG. 3B is an exploded perspective view of an illustrative embodiment of the electronic panel shown in FIG. 3A. Referring to FIG. 3B, the electronic panel EP includes the input sensor IS and the display panel DP. The input sensor IS may be directly disposed on the display panel DP and may be manufactured in a continuous process with the process of the display panel DP, however, for the convenience of explanation, the display panel DP and the input sensor IS are shown separated from each other.

The display panel DP may be a flexible display panel, e.g., an organic light emitting display panel. The display panel DP includes a pixel area PXA in which a pixel PX is disposed and a non-pixel area NPXA defined adjacent to the pixel area PXA when viewed in a plan view. The pixel PX is not disposed in the non-pixel area NPXA, and peripheral components, such as signal lines and insulating patterns, are disposed in the non-pixel area NPXA. The pixel area PXA and the non-pixel area NPXA may respectively correspond to the display area DA and the bezel area BZA. However, the corresponding areas (e.g., a shape or size) need not be completely identical.

The pixel PX may be provided in a plural number, and the pixels PX are respectively connected to the signal lines GL, DL, and PL. The pixel PX and the signal lines GL, DL, and PL may be disposed on the base substrate of the display panel DP. Pads connected to the signal lines GL, DL, and PL may be disposed in the non-pixel area NPXA.

As an example, the pixel PX includes a first thin film transistor TR1, a second thin film transistor TR2, a capacitor CP, and a light emitting element ELD, however, it should not be limited thereto or thereby. That is, the pixel PX may include electronic elements having various configurations and arrangements, and should not be limited to a particular embodiment.

The first thin film transistor TR1 may be connected to a gate line GL and a data line DL. The first thin film transistor TR1 may be, but is not limited to, a switching transistor to control a turn-on and a turn-off of the pixel PX. The first thin film transistor TR1 is turned on in response to a gate signal applied thereto via the gate line GL and applies a data signal applied thereto via the data line DL to the capacitor CP.

The capacitor CP may be connected to the first thin film transistor TR1 and the power line PL. The capacitor CP may be charged with an amount of charge corresponding to a difference between the data signal provided from the first thin film transistor TR1 and a power voltage applied to the power line PL.

The second thin film transistor TR2 may be connected to the first thin film transistor TR1, the capacitor CP, and the light emitting element ELD. The second thin film transistor TR2 may control a driving current flowing through the light emitting element ELD depending on the charge amount charged in the capacitor CP. The turn-on time of the second thin film transistor TR2 may be determined according to the charge amount charged in the capacitor CP. The second thin film transistor TR2 applies the power voltage provided thereto through the power line PL during the turn-on time to the light emitting element ELD.

The light emitting element ELD may receive the power voltage provided from the power line PL. The light emitting element ELD may generate light or may control the amount of light in response to an electrical signal. For example, the light emitting element ELD may include an organic light emitting element, a quantum dot light emitting element, or an electrophoretic element. The light emitting element ELD may emit the light during the turn-on time of the second thin film transistor TR2. The light emitting element ELD includes a light emitting material. The light emitting element ELD may generate a color light corresponding to the light emitting material. As an example, the color light generated by the light emitting element ELD may be one of red, green, blue, and white colors.

The input sensor IS is disposed on the display panel DP. As described above, the input sensor IS may be directly disposed on the display panel DP. The input sensor IS may sense the user input and may obtain information on position and intensity of the user input. The input sensor IS may include a plurality of sensing electrodes TE1 and TE2 and a plurality of sensing lines TL1 and TL2.

The sensing electrodes TE1 and TE2 may be disposed to overlap with a display area DA, however, they should not be limited thereto or thereby. The sensing electrodes TE1 and TE2 may be disposed to overlap with a portion of the bezel area BZA. The sensing electrodes TE1 and TE2 may include a first sensing electrode TE1 and a second sensing electrode TE2, which receive different electrical signals from each other. The input sensor IS obtains information on the user input according to a variation in capacitance between the first sensing electrode TE1 and the second sensing electrode TE2.

The first sensing electrode TE1 may extend in the second direction DR2. The first sensing electrode TE1 may be provided in a plural number, and the first sensing electrodes TE1 may be arranged in the first direction DR1 to be spaced apart from each other. The first sensing electrode TE1 may include a plurality of first sensing patterns SP1 arranged in the second direction DR2 and electrically connected to each other.

The second sensing electrode TE2 may extend in the first direction DR1. The second sensing electrode TE2 may be provided in a plural number, and the second sensing electrodes TE2 may be arranged in the second direction DR2 to be spaced apart from each other. The second sensing electrode TE2 may include a plurality of second sensing patterns SP2 arranged in the first direction DR1 and electrically connected to each other.

The sensing lines TL1 and TL2 may be arranged in the non-pixel area NPXA of the display panel DP, and terminal pads may be respectively connected to the sensing lines TL1 and TL2. The terminal pads may be electrically connected to the driving control module DCM. The sensing lines TL1 and TL2 may include a first sensing line TL1 and a second sensing line TL2. The first sensing line TL1 may be connected to the first sensing electrode TE1 to transmit the electrical signal provided through the driving control module DCM to the first sensing electrode TE1. The second sensing line TL2 may be connected to the second sensing electrode TE2 to transmit the electrical signal provided through the driving control module DCM to the second sensing electrode TE2.

The electronic panel EP may include three areas. In detail, the electronic panel EP may include a first non-bending area NBA1, a bending area BA extending from the first non-bending area NBA1, and a second non-bending area NBA2 extending from the bending area BA. The second non-bending area NBA2 faces the first non-bending area NBA1 in a bent state, as shown in FIG. 6B. The bending area BA has a predetermined curvature in the bent state. The pixel PX may be disposed in the first non-bending area NBA1.

The width of the electronic panel EP in the first direction DR1, i.e., a width in a direction substantially parallel to the bending axis, may vary depending on areas. The bending area BA may have a width smaller than the width of the first non-bending area NBA1. As the bending area BA has a relatively small width, the bending area BA may be easily bent. The shape of the bending area BA shown in FIGS. 3A and 3B is merely exemplary. For example, contrary to FIGS. 3A and 3B, the width in the first direction DR1 of the bending area BA may gradually decrease as the distance from the first non-bending area NBA1 increases.

Referring to FIG. 3A again, the stress control layer SCF may be disposed in the bending area BA. The stress control layer SCF may be provided to disperse the stress caused by bending the bending area BA of the electronic panel EP. As a result, the stress applied to the bending area BA may be reduced, and the electronic panel EP may be prevented from being deformed or damaged due to the stress.

In addition, the stress control layer SCF may overlap with the first non-bending area NBA1 and the second non-bending area NBA2, as shown, e.g., in FIG. 6B. The stress is rapidly changed in an area where the bending starts or an area where the bending stops, i.e the a boundary between the first non-bending area NBA1 and the bending area BA and the boundary between the second non-bending area NBA2 and the bending area BA. The change in stress may cause the deformation of the electronic panel EP. Since the stress control layer SCF is disposed to overlap with a portion of the first non-bending area NBA1 and the second non-bending area NBA2, the change in stress acting on the area where the bending starts or the area where the bending stops may be dispersed, and the electronic panel EP may be prevented from being deformed or damaged due to the stress.

As described above, the optical sheet LS may be provided with the recessed area RA defined therein to define the space in which the stress control layer SCF is disposed on the first non-bending area NBA1. The stress control layer SCF may be disposed in the recessed area RA and may not overlap with the optical sheet LS. Accordingly, it is not necessary to increase the non-pixel area NPXA or the bezel area BZA for the space in which the stress control layer SCF is disposed, and thus a slim bezel may be realized.

The stress control layer SCF may be formed by coating a resin on the electronic panel EP. In this case, the stress control layer SCF may be formed at at least a portion of the recessed area RA defined in the optical sheet LS, however, it should not be limited thereto or thereby. That is, the stress control layer SCF may be a sheet type or a film type, such as a synthetic resin film. As an example, the stress control layer SCF may include an organic material, however, according to another illustrative embodiment, the stress control layer SCF may include an organic/inorganic composite material.

The protective film PF is disposed on a lower surface of the electronic panel EP. The protective film PF may include a first protective film PF1 and a second protective film PF2, which are spaced apart from each other. The first protective film PF1 and the second protective film PF2 may be attached together to the electronic panel EP. The first protective film PF1 may be disposed in the first non-bending area NBA1 of the display panel DP. The second protective film PF2 may be disposed in the second non-bending area NBA2 of the display panel DP.

The protective film PF may include a synthetic resin film. However, the material for the protective film PF should not be limited to the synthetic resin and may include an organic/inorganic composite material. The protective film PF may include a porous organic layer and an inorganic material filled in pores of the organic layer.

The driving control module DCM may include a first circuit board MCB (or a "driving circuit board), a second circuit board FCB connecting the first circuit board MCB and the electronic panel EP, and a driving chip F-IC mounted on the electronic panel EP. The driving chip F-IC may be mounted on the second circuit board FCB. A plurality of passive elements and a plurality of active elements may be mounted on the first circuit board MCB. The first circuit board MCB may be a rigid circuit board or a flexible circuit board, and the second circuit board FCB may be the flexible circuit board. In addition, the first circuit board MCB may be electrically connected to a mother board of the electronic module EM (refer to FIG. 1B) via the electronic component connector. However, according to another embodiment, the first circuit board MCB may be omitted, and the second circuit board FCB may be electrically connected to the mother board.

The driving control module DCM may be connected to the electronic panel EP in the second non-bending area NBA2 of the electronic panel EP. According to the bending of the electronic panel EP, the driving control module DCM may face the first non-bending area NBA1. As a result, it is not necessary to increase the non-pixel area NPXA or the bezel area BZA for the space in which the driving control module DCM is disposed, and thus the slim bezel may be implemented.

Figure 4A:
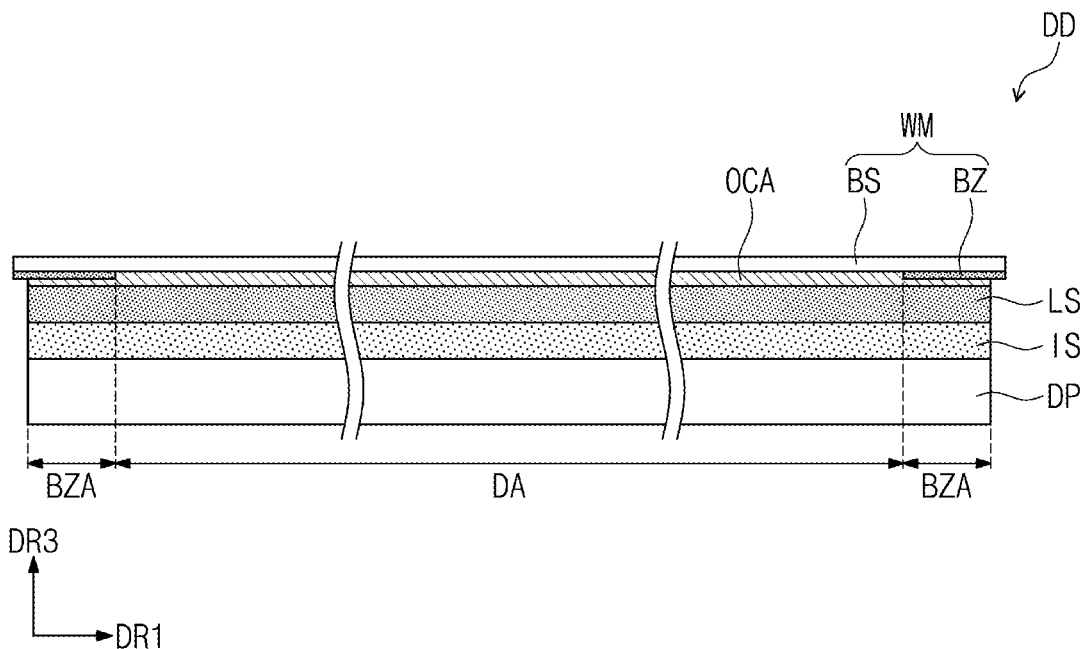
FIG. 4A is a cross-sectional view of an illustrative embodiment of the display device of FIG. 3A.
Figure 4B:
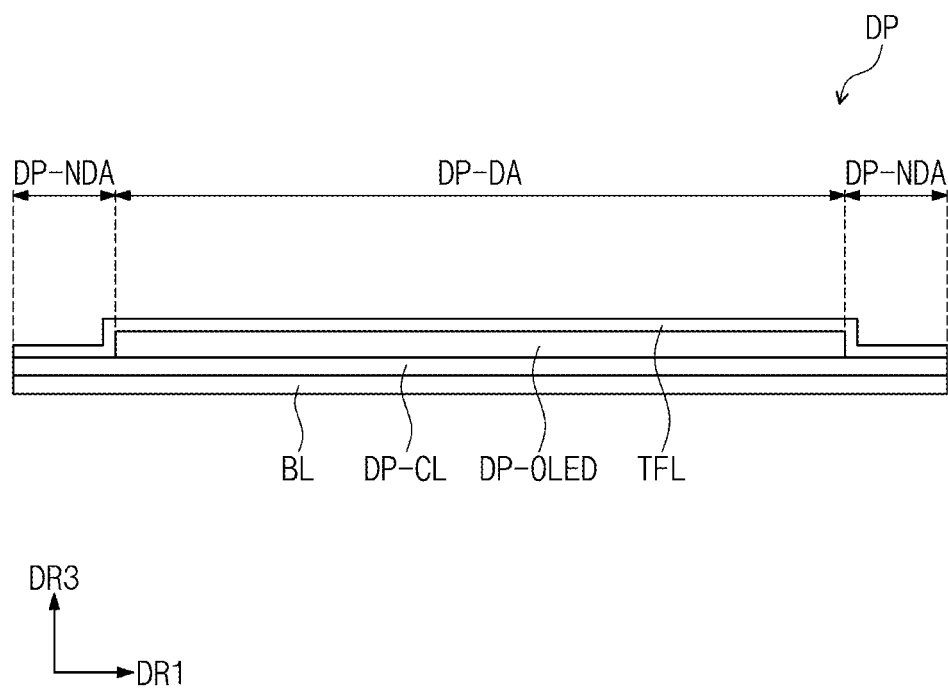
FIGS. 4B and 4C are cross-sectional views of an illustrative embodiment of the display panel of FIG. 3A.
Figure 4C:
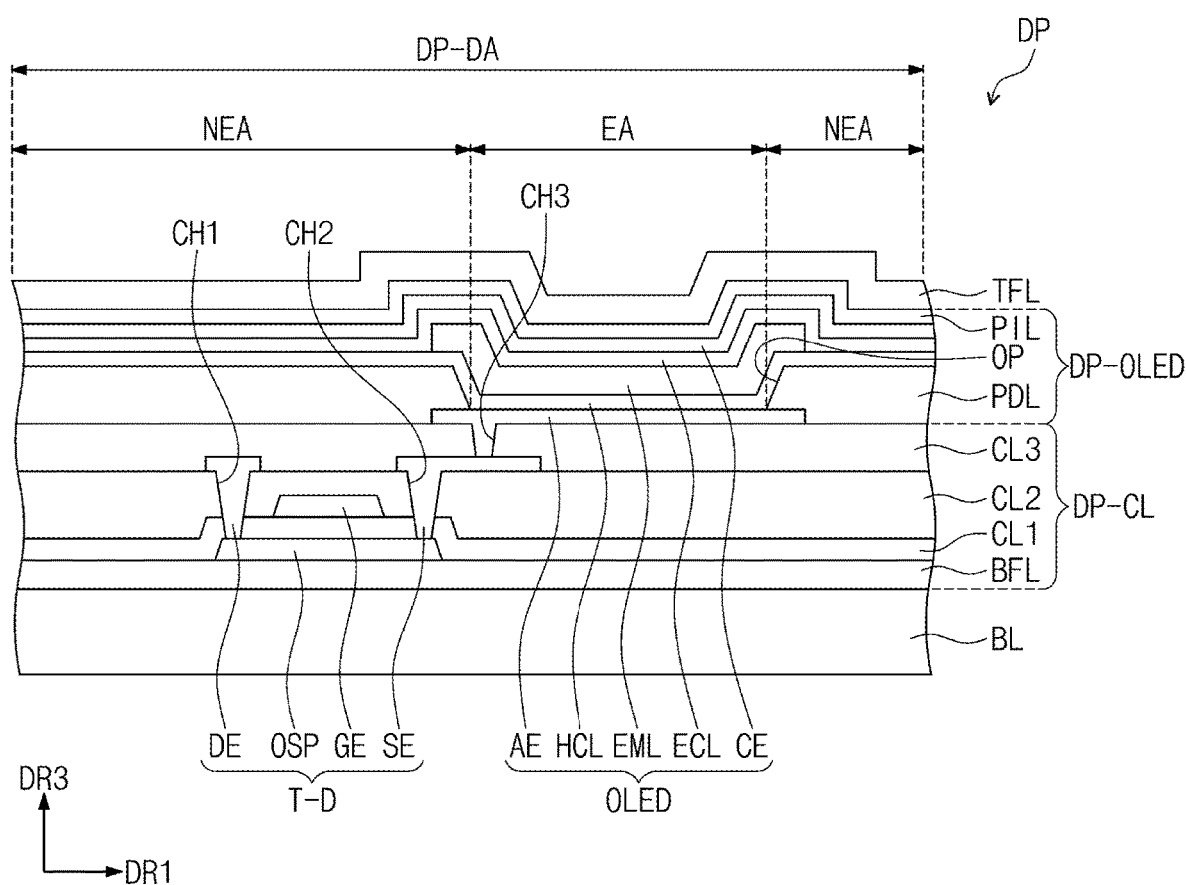

FIG. 4A is a cross-sectional view of an illustrative embodiment of the display device DD of FIG. 3A. FIGS. 4B and 4C are cross-sectional views of an illustrative embodiment of the display panel DP of FIG. 3A. Specifically, FIG. 4B is a schematic cross-sectional view of the display panel DP shown in FIG. 4A, and FIG. 4C is a cross-sectional view of a portion of the display area DP-DA of FIG. 4B.

Referring to FIG. 4A, the display device DD includes the display panel DP, the input sensor IS, the optical sheet LS, and the window WM. The display panel DP, the input sensor IS, and the optical sheet LS respectively correspond to the display panel DP, the input sensor IS, and the optical sheet LS, which are included in the display module DM of FIGS. 3A and 3B. The window WM and the optical sheet LS may be coupled to each other by an adhesive layer OCA, and the optical sheet LS and the input sensor IS (or the display panel DP) may be coupled to each other by an adhesive layer.

The window WM may include a base layer BS and a bezel pattern BZ. The base layer BS may include a transparent material and may include a glass substrate, a sapphire substrate, or a plastic substrate. The base layer BS may have a single-layer or multi-layer structure. As an example, the base layer BS may include a plurality of synthetic resin films. As an example, the base layer BS may include a glass substrate and a synthetic resin film coupled to the glass substrate by an adhesive member.

The bezel pattern BZ may be directly disposed on a lower surface of the glass substrate or may be directly disposed on one surface of the synthetic resin film. The organic material and/or an inorganic material may be directly deposited or printed on the base layer BS. The synthetic resin film on which the bezel pattern BZ is formed may be attached to the lower surface of the base layer BS. The bezel pattern BZ may have a single-layer or multi-layer structure. The bezel pattern BZ having the multi-layer structure may include a buffer layer to improve an adhesive force, a pattern layer providing a predetermined pattern, and an achromatic layer. The window WM may further include a functional coating layer. The functional coating layer may include an anti-fingerprint layer, an anti-reflective layer, and a hard coating layer.

The input sensor IS may be directly disposed on a base surface provided by the display panel DP. In the following descriptions, the expression that a component "B" is directly disposed on a component "A" means that no intervening elements, such as an adhesive layer/an adhesive member, are present between the component "B" and the component "A". The component "B" may be formed on a base surface provided by the component "A" through successive processes after the component "A" is formed. However, they should not be limited thereto or thereby. The input sensor IS may be coupled to the display panel DP after being separately manufactured. In this case, an adhesive layer may be disposed between the input sensor IS and the display panel DP.

The optical sheet LS is disposed between the display panel DP and the window WM. In addition, the optical sheet LS may be disposed between the input sensor IS and the window WM. The optical sheet LS may have a multi-layer structure including an adhesive layer. Due to the adhesive layer, the optical sheet LS may be attached to an upper surface of the input sensor IS.

FIG. 4B is a schematic cross-sectional view of the display panel DP shown in FIG. 4A. Referring to FIG. 4B, the display panel DP includes a base layer BL, a circuit element layer DP-CL disposed on the base layer BL, a display element layer DP-OLED disposed on the circuit element layer DP-CL, and an upper insulating layer TFL disposed on the circuit element layer DP-CL.

The base layer BL may include a transparent flexible substrate. The base layer BL may include a substrate having a substantially uniform refractive index in a visible light wavelength range.

The circuit element layer DP-CL may include at least one insulating layer and a circuit element. The circuit element layer DP-CL may include at least a transistor. The insulating layer of the circuit element layer DP-CL may include at least one inorganic layer and/or at least one organic layer. The circuit element includes signal lines and a pixel driving circuit.

The display element layer DP-OLED may include at least light emitting element. The display element layer DP-OLED may include organic light emitting diodes as its light emitting element. The display element layer DP-OLED may include a pixel definition layer, e.g., an organic material. The display element layer DP-OLED may overlap with a display area DP-DA. The display area DP-DA may correspond to the display area DA of FIGS. 3A and 4A.

The upper insulating layer TFL may include a plurality of thin layers. The upper insulating layer TFL may include a thin layer encapsulation stack structure. As an example, the upper insulating layer TFL may include at least one inorganic layer and/or at least one organic layer. The upper insulating layer TFL protects the display element layer DP-OLED from moisture, oxygen, and dust particles. The upper insulating layer TFL is disposed on the display element layer DP-OLED in the display area DP-DA and disposed on the circuit element layer DP-CL in the non-display area DP-NDA. The non-display area DP-NDA may correspond to the bezel area BZA of FIGS. 3A and 4A.

FIG. 4C is a cross-sectional view of a portion of the display area DP-DA of FIG. 4B. Referring to FIG. 4C, the circuit element layer DP-CL may include a plurality of insulating layers. The circuit element layer DP-CL may include a buffer layer BFL, a first inorganic layer CL1, and a second inorganic layer CL2. In addition, the circuit element layer DP-CL may include an organic layer CL3. FIG. 4C illustrates the positional relationship between a semiconductor pattern OSP, a control electrode GE, an input electrode DE, and an output electrode SE, which form the driving transistor T-D, as a representative example. First to third through holes CH1 to CH3 are also illustrated by way of example.

The display element layer DP-OLED may include the organic light emitting diode OLED. The organic light emitting diode OLED may include a first electrode AE, a hole control layer HCL, a light emitting layer EML, an electron control layer ECL, and a second electrode CE. In addition, the display element layer DP-OLED may include a pixel definition layer PDL.

The first electrode AE may be disposed on the organic layer CL3. The first electrode AE may be connected to the output electrode SE through the third through hole CH3 defined through the organic layer CL3. The pixel definition layer PDL is provided with an opening OP defined therethrough. At least a portion of the first electrode AE is exposed through the opening OP of the pixel definition layer PDL.

The display area DP-DA of the display panel DP may include a light emitting area EA and a non-light emitting area NEA disposed adjacent to the light emitting area EA. The non-light emitting area NEA may surround the light emitting area EA. In the illustrated embodiment, the light emitting area EA may be defined to correspond to the portion of the first electrode AE exposed through the opening OP.

The hole control layer HCL may be commonly disposed on the light emitting area EA and the non-light emitting area NEA. The hole control layer HCL may include a hole transport layer and may further include a hole injection layer. The light emitting layer EML may be disposed on the hole control layer HCL. The light emitting layer EML may be disposed in an area corresponding to the opening OP. That is, the light emitting layer EML may be formed in each of the pixels PX after being divided into plural portions. The light emitting layer EML may include an organic material and/or an inorganic material. The light emitting layer EML may generate a predetermined color light.

An electron control layer ECL may be disposed on the light emitting layer EML. The electron control layer ECL may include an electron transport layer and may further include an electron injection layer. The hole control layer HCL and the electron control layer ECL may be commonly formed in the pixels PX using an open mask. A second electrode CE may be disposed on the electron control layer ECL. The second electrode CE may be commonly disposed in the pixels PX.

A protective layer PIL may be disposed on the second electrode CE. As an example, the protective layer PIL may include an inorganic material, such as silicon oxide, silicon nitride, or silicon oxynitride. The upper insulating layer TFL may be disposed on the protective layer PIL.

Figure 4D:
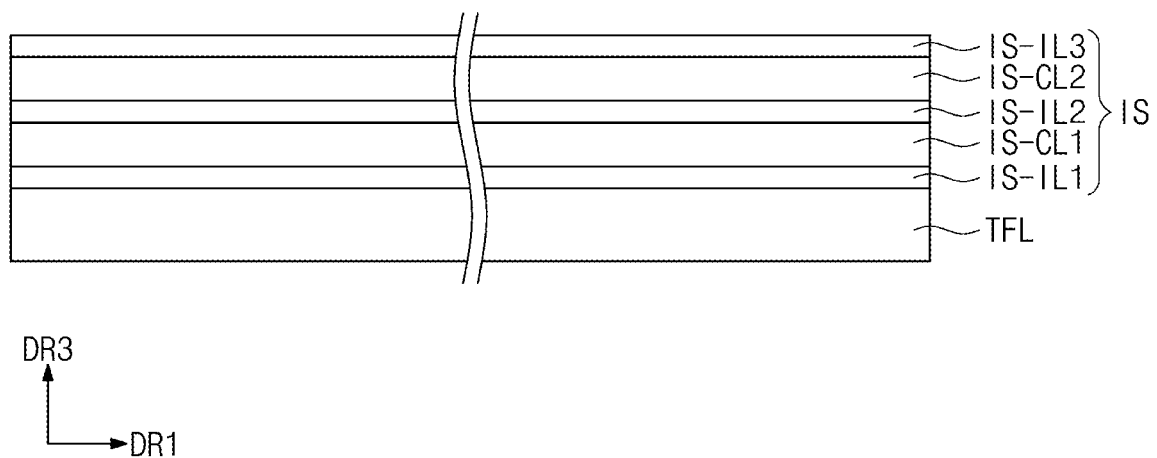
FIG. 4D is a cross-sectional view of an illustrative embodiment of the input sensor shown in FIG. 3A.

FIG. 4D is a cross-sectional view of an illustrative embodiment of the input sensor IS shown in FIG. 3B. Referring to FIG. 4D, the input sensor IS may include a first insulating layer IS-IL1, a first conductive layer IS-CL1, a second insulating layer IS-IL2, a second conductive layer IS-CL2, and a third insulating layer IS-IL3. The first insulating layer IS-IL1 may be directly disposed on the upper insulating layer TFL. In an illustrative embodiment, the first insulating layer IS-IL1 may be omitted. Each of the first conductive layer IS-CL1 and the second conductive layer IS-CL2 may include a plurality of conductive patterns. The conductive patterns may correspond to the first sensing patterns SP1 and the second sensing patterns SP2 of FIG. 3B.

Each of the first conductive layer IS-CL1 and the second conductive layer IS-CL2 may have a single-layer structure or a multi-layer structure of layers stacked in the third directional axis DR3. The conductive layer having the multi-layer structure may include at least two layers of transparent conductive layers and metal layers. The conductive layer having the multi-layer structure may include metal layers including metals different from each other. The transparent conductive layer may include indium tin oxide (ITO), indium zinc oxide (IZO), zinc oxide (ZnO), indium tin zinc oxide (ITZO), PEDOT, a metal nanowire, or a graphene. The metal layer may include molybdenum, silver, titanium, copper, aluminum, or alloys thereof. For instance, each of the first conductive layer IS-CL1 and the second conductive layer IS-CL2 may have a three-layer structure of titanium/aluminum/titanium.

Each of the first insulating layer IS-IL1, the second insulating layer IS-IL2, and the third insulating layer IS-IL3 may include an inorganic layer and/or an organic layer. The inorganic material may include at least one of aluminum oxide, titanium oxide, silicon oxide, silicon oxynitride, zirconium oxide, and hafnium oxide. The organic layer may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin.

Figure 5A:
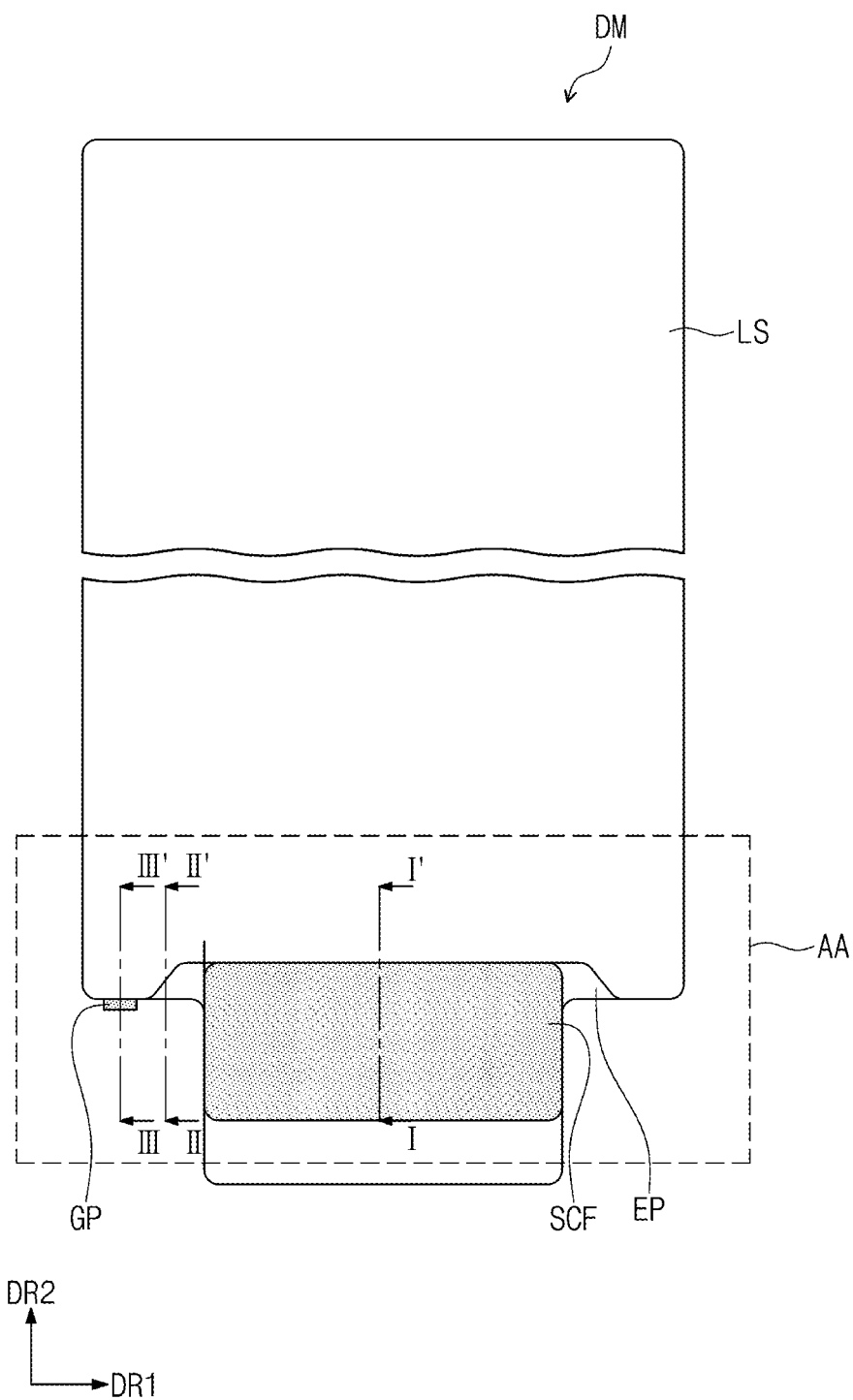
FIG. 5A is a plan view of an illustrative embodiment of a display module shown in FIG. 3A.
Figure 5B:
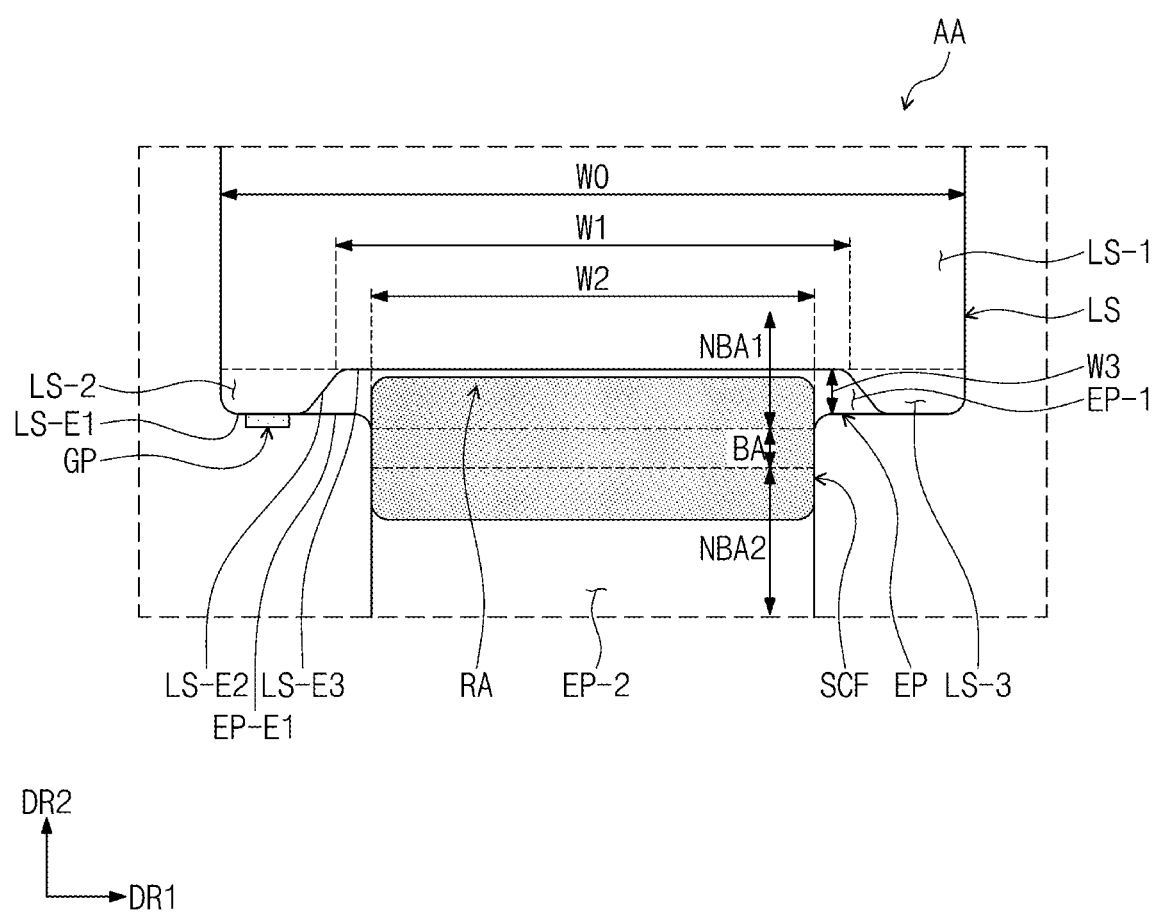
FIG. 5B is a partially enlarged plan view of an illustrative embodiment of a portion of the display module of FIG. 5A.

FIG. 5A is a plan view of an illustrative embodiment of the display module DM shown in FIG. 3A. FIG. 5B is a partially enlarged plan view of an illustrative embodiment of a portion of the display module DM of FIG. 5A.

Referring to FIG. 5A, an assembled state of the display module DM shown in FIG. 3A is shown. For the convenience of explanation, FIG. 5A shows the display module DM in a state in which the window WM and the driving control module DCM are removed from the display device DD of FIG. 3A. Accordingly, the optical sheet LS is disposed at an uppermost position. When viewed in a plan view, a portion of the electronic panel EP, which does not overlap with the optical sheet LS is shown. In addition, the stress control layer SCF that does not overlap with the optical sheet LS is shown. That is, the optical sheet LS and the stress control layer SCF are disposed on the electronic panel EP.

The display module DM (or the display device DD) may further include a gasket pattern GP disposed at at least a portion of a side surface of the optical sheet LS. The gasket pattern GP may be a waterproof member or a waterproof pattern to prevent liquid or other contaminants and the like from entering into the display module DM from the outside. The gasket pattern GP may be disposed at edges of the display panel DP and the optical sheet LS, is which are aligned with each other.

In the electronic device ED (refer to FIG. 1A) including the display device DD, the gasket pattern GP is disposed in an area where a waterproofing treatment is required since the area is vulnerable to the entering of the liquid depending on the configuration or design of components in the electronic device ED. For example, for a connector or an input/output port, openings may be defined in at least a portion of the external case EDC or the bracket BRK of FIG. 1B. In another illustrative example, an area that is not completely sealed from the outside may be provided to place an electronic component, such as an antenna or a microphone, or a mechanical component, such as an actuator. When these areas are disposed adjacent to the display module DM, the gasket pattern GP may be provided.

To implement a slim bezel, the gasket pattern GP may be disposed only in the area where the above-described waterproofing treatment is required without covering the entire side surface of the display module DM. Instead, other areas of the display module DM may be protected from the external liquid by a waterproof member packed in the external case EDC or the bracket BRK shown in FIG. 1B. That is, the gasket pattern GP may be formed in a portion of the area which is difficult to be protected by the external case EDC or the bracket BRK according to the shape and design of the electronic device ED. The gasket pattern GP may be formed by coating a curable resin on a partial area of the display module DM. As an example, the gasket pattern GP may be formed by coating a cured-in-place gasket (CIPG) on the side surface of the electronic panel EP and the optical sheet LS.

Referring to FIG. 5B, the partial area AA of the display module DM is shown. The electronic panel EP may include a first portion EP-1 overlapping with the first non-bending area NBA1 and a second portion EP-2 protruding from the first portion EP-1 in the second direction DR2. The second portion EP-2 may overlap with the bending area BA and the second non-bending area NBA2 and may further overlap with a portion of the first non-bending area NBA1. The width in the first direction DR1 of the second portion EP-2 may be smaller than a width in the first direction DR1 of the first portion EP-1. As described above, this configuration allows the bending area BA to be easily bent.

The recessed area RA may be defined in the optical sheet LS, which is recesseded toward the center of the optical sheet LS, to define the space in which the stress control layer SCF is disposed. To this end, the optical sheet LS may include a first portion LS-1 and second and third portions LS-2 and LS-3 protruding from the first portion LS-1 to the second direction DR2. The first, second, and third portions LS-1, LS-2, and LS-3 may overlap with the first non-bending area NBA1 and may define the recessed area RA. The first portion LS-1 may face the stress control layer SCF in the second direction DR2, and the second portion LS-2 and the third portion LS-3 may face the stress control layer SCF in the first direction DR1. The second portion LS-2 and the third portion LS-3 may face each other with the stress control layer SCF interposed therebetween.

The side of the recessed area RA defined in the optical sheet LS is determined depending on the position at which the gasket pattern GP is disposed. As an example, the gasket pattern GP is disposed at a first surface LS-E1 of the optical sheet LS and a first surface EP-E1 of the electronic panel EP, which are aligned with each other. A second surface LS-E2 of the optical sheet LS extends from the first surface LS-E1 and faces the stress control layer SCF. The second surface LS-E2 may extend inwardly of the optical sheet LS with respect to the first surface LS-E1. In this case, since the optical sheet LS and the electronic panel EP are not aligned with each other, a step difference is formed. When the step difference is formed in the area in which the gasket pattern GP is disposed, the gasket pattern GP may not make contact with the optical sheet LS during the coating of the gasket pattern GP. As a result, a waterproof effect of the gasket pattern GP may be reduced. That is, a portion of the surface of the optical sheet LS may be aligned with the electronic panel EP so that a gap is not formed between the gasket pattern GP and the optical sheet LS by the recessed area RA.

The width in the first direction DR1 of the recessed area RA is referred to as a first width W1, and the width in the first direction DR1 of the stress control layer SCF is referred to as a second width W2. The second width W2 may be substantially the same as the width of the bending area BA shown in FIG. 5B. As an example, the first width W1 may correspond to the width of the third surface LS-E3 extending in the first direction DR1 from the second surface LS-E2. The first width W1 may be equal to or greater than the second width W2. That is, the first width W1 in the first direction DR1 of the recessed area RA may be equal to or greater than the second width W2 in the first direction DR1 of the stress control layer SCF such that the stress control layer SCF is disposed in the recessed area RA. In addition, a maximum width (the first width W1) of the recessed area RA may be greater than the second width W2 in the first direction DR1 of the stress control layer SCF and may be smaller than the width W0 of the first non-bending area NBA1.

In addition, the width in the second direction DR2 of the stress control layer SCF disposed in the first non-bending area NBA1 is referred to as a third width W3. The third width W3 is should have a length large enough to disperse a variation in stress applied to the area where the bending of the electronic panel EP starts. That is, the third surface LS-E3 is should be spaced apart from the bending area BA by at least the third width W3. As an example, the third width W3 may be about 0.36 mm.

The stress control layer SCF may be disposed on the bending area BA and may disperse the stress applied to the electronic panel EP due to the bending. In addition, the stress control layer SCF may overlap with the first non-bending area NBA1 and the second non-bending area NBA2. Accordingly, the variation in stress, which occurs in the boundary between the first non-bending area NBA1 and the bending area BA and in the boundary between the second non-bending area NBA2 and the bending area BA, may be dispersed. As a result, the electronic panel EP may be prevented from being deformed and damaged, such as folding or twisting, due to the stress.

FIG. 5B shows the stress control layer SCF partially disposed in the recessed area RA, however, the illustrative embodiments should not be limited thereto or thereby. For example, the stress control layer SCF may be disposed entirely within the entire the recessed area RA. In addition, the stress control layer SCF is shown making contact with the third surface LS-E3 of the optical sheet LS, however, it should not be limited thereto or thereby. For example, the stress control layer SCF may have the third width W3 in the first non-bending area NBA1 and may be spaced apart from the third surface LS-E3 of the optical sheet LS by a predetermined distance.

Figure 6A:
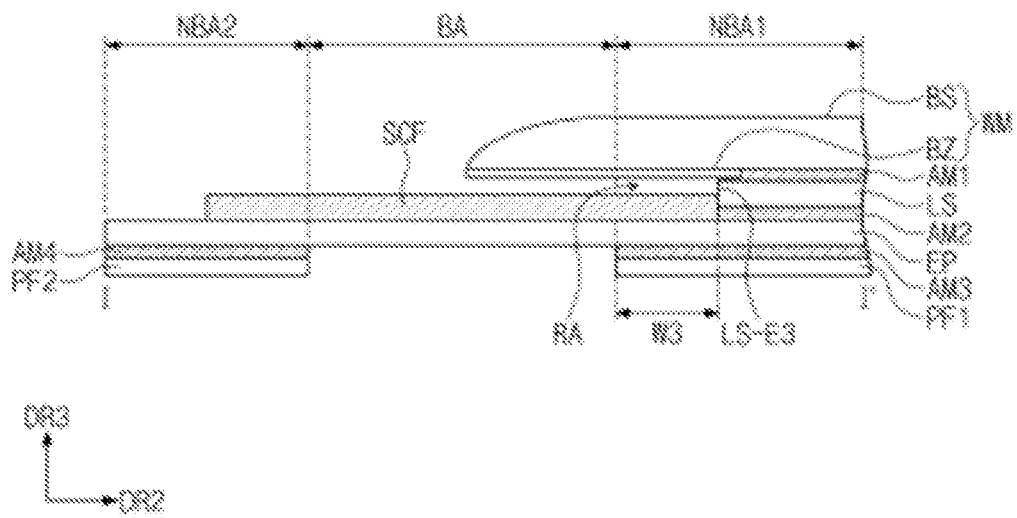
FIGS. 6A to 6C are cross-sectional views of an illustrative embodiment of the display device taken along a line I-I' of FIG. 5A in different bending configurations.
Figure 6B:
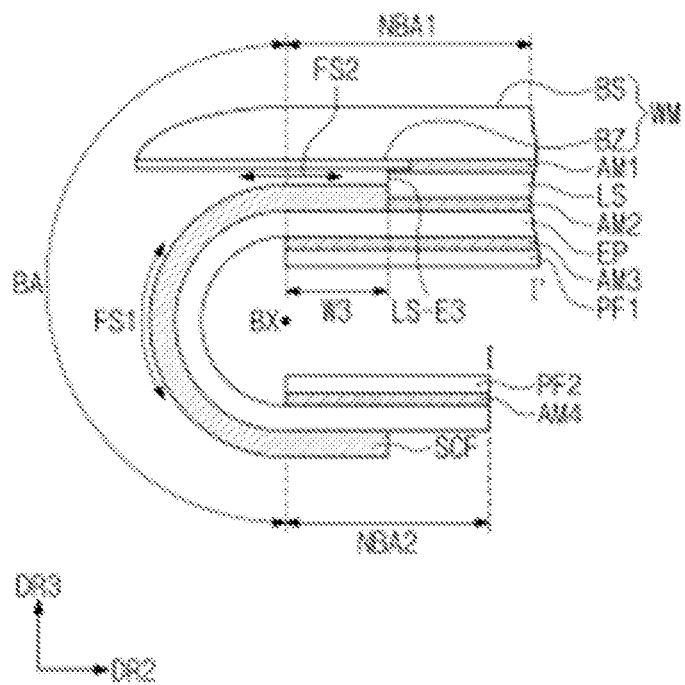
Figure 6C:
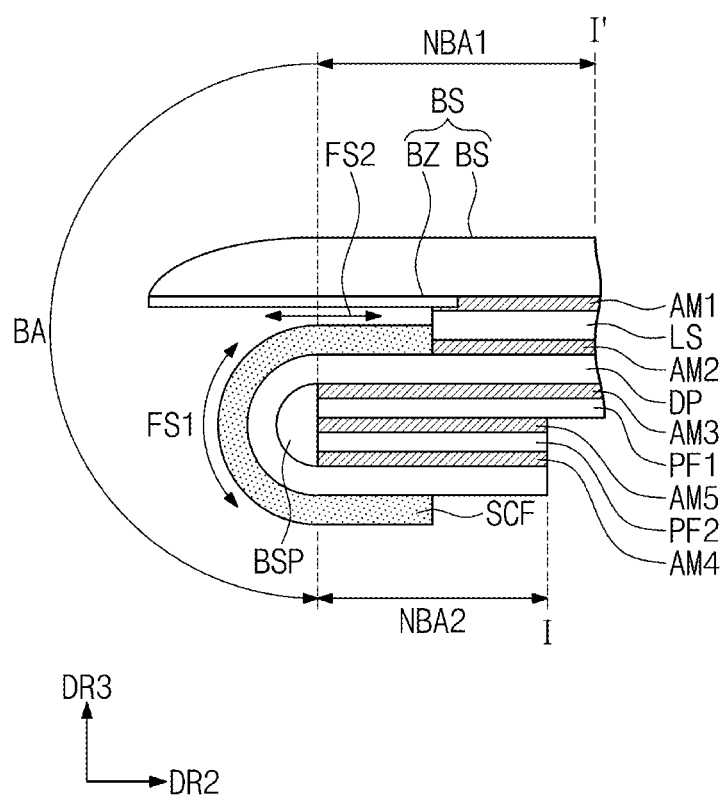

FIGS. 6A to 6C are cross-sectional views of an illustrative embodiment of the display device taken along a line I-I' of FIG. 5A in different bending configurations. FIG. 6A shows an unfolded state of the display device DD, and FIG. 6B shows a bent state of the display device DD. FIG. 6C shows a bent state of the display device DD.

FIGS. 6A to 6E show the window WM including the base layer BS and the bezel pattern BZ directly disposed on the lower surface of the base layer BS. As described above, an adhesive member AM1 (hereinafter, referred to as a "first adhesive member") is disposed between the window WM and the optical sheet LS, an adhesive member AM2 (hereinafter, referred to as a "second adhesive member") is disposed between the optical sheet LS and the electronic panel EP, an adhesive member AM3 (hereinafter, referred to as a "third adhesive member") is disposed between a first protective film PF1 and the electronic panel EP, and an adhesive member AM4 (hereinafter, referred to as a "fourth adhesive member") is disposed between a second protective film PF2 and the electronic panel EP. The first to fourth adhesive members AM1 to AM4 may be a pressure sensitive adhesive (PSA) film, an optically clear adhesive (OCA) film, or an optically clear resin (OCR).

The first protective film PF1 is disposed to overlap with the first non-bending area NBA1, and the second protective film PF2 is disposed to overlap with the second non-bending area NBA2. The first protective film PF1 and the second protective film PF2 are disposed on the lower surface of the electronic panel EP. The first protective film PF1 and the second protective film PF2 may be obtained by attaching one protective film to the electronic panel EP and removing a portion of the protective film corresponding to the bending area BA. Accordingly, an edge of the first protective film PF1 may be aligned with the third edge LS-E3 of the first non-bending area NBA1. In the same manner, an edge of the second protective film PF2 may be aligned with the edge of the second non-bending area NBA2.

Referring to FIG. 6A, the stress control layer SCF is disposed on the first non-bending area NBA1, the bending area BA, and the second non-bending area NBA2 of the electronic panel EP. The optical sheet LS is disposed on the first non-bending area NBA1 of the electronic panel EP and does not overlap with the stress control layer SCF. The stress control layer SCF may have the third width W3 in the second direction DR2 in the first non-bending area NBA1 to disperse the variation in stress generated from the boundary between the first non-bending area NBA1 and the bending area BA. That is, the stress control layer SCF may overlap the recessed area RA over the third width W3 in the second direction DR2. Correspondingly, the third surface LS-E3 of the optical sheet LS facing the stress control layer SCF may be spaced apart from the bending area BA by at least the third width W3. As mentioned above, the edge of the first protective film PF1 is the as aligned with the edge of the first non-bending area NBA1, thereby the edge of the first protective film PF1 is not aligned with the edge of the optical sheet LS-ES3, which corresponds to the recessed area RA as shown in FIGS. 6A and 6B.

Referring to FIG. 6B, the electronic panel EP and the stress control layer SCF corresponding to the bending area BA are bent with respect to a bending axis BX. The stress control layer SCF form a curvature with the bending area BA of the electronic panel EP with respect to the bending axis BX. In the bending area BA, a first tensile stress FS1 is generated in the electronic panel EP and the stress control layer SCF. The stress control layer SCF disperses the tensile stress applied to the electronic panel EP. As a result, the tensile stress applied to the electronic panel EP is reduced.

In addition, a second tensile stress FS2 is generated in the bending area BA with respect to the first non-bending area NBA1 and the bending area BA, and a tensile force is generated in the first non-bending area NBA1 in the opposite direction. The stress control layer SCF overlapping with the first non-bending area NBA1 disperses the tensile force. The stress control layer SCF is required to have a length in the second direction DR2 that is long enough to disperse the tensile force. When the length of the stress control layer SCF in the first non-bending area NBA1 is short, the stress control layer SCF may not sufficiently disperse the tensile force applied to the electronic panel EP, and thus the electronic panel EP may be folded or twisted. To prevent this, the stress control layer SCF may extend to the first non-bending area NBA1 by the third width W3.

Referring to FIG. 6C, the display device DD may further include a bending supporter BSP to support the bending area BA of the electronic panel EP. The bending supporter BSP may be disposed to face the stress control layer SCF with the bending area BA of the electronic panel EP interposed therebetween. The bending supporter BSP may be disposed on the lower surface of the electronic panel EP to fix the electronic panel EP. In addition, similar to the stress control layer SCF, the bending supporter BSP may disperse the stress applied to the electronic panel EP. As a result, the electronic panel EP may be prevented from being deformed and damaged, such as the folding or twisting.

The bending supporter BSP may be disposed in an inner space defined by the bending of the electronic panel EP. As an example, the bending supporter BSP may be formed by coating a resin in the inner space, however, it should not be limited thereto or thereby. The bending supporter BSP may be formed by inserting a physical structure, which is previously manufactured, into the inner space. The bending supporter BSP may include an organic material, however, it should not be limited thereto or thereby. According to another embodiment, the bending supporter BSP may include an organic/inorganic composite material or an inorganic material.

The display device DD may further include an adhesive member AM5 (hereinafter, referred to as a "fifth adhesive member") to fix the first and second non-bending areas NBA1 and NBA2 of the electronic panel EP. The fifth adhesive member AM5 may be disposed between the first protective film PF1 and the second protective film PF2, which face each other. Similar to the first to fourth adhesive members AM1 to AM4, the fifth adhesive member AM5 may be a pressure sensitive adhesive (PSA) film, an optically clear adhesive (OCA) film, or an optically clear resin (OCR).

Figure 6D:
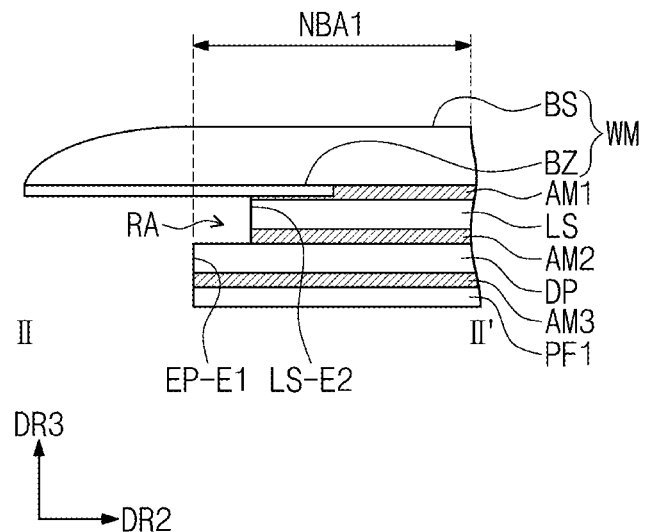
FIG. 6D is a cross-sectional view of an illustrative embodiment of the display device taken along a line II-II' of FIG. 5A.

FIG. 6D is a cross-sectional view of an illustrative embodiment of the display device taken along a line II-II' of FIG. 5A. Referring to FIG. 6D, an opening of the recessed area RA may be defined between the electronic panel EP and the window WM due to the recessed area RA defined in the optical sheet LS. That is, the second surface LS-E2 of the optical sheet LS may not be aligned with the first surface EP-E1 of the electronic panel EP. The opening of the recessed area RA may be defined depending on the shape of the optical sheet LS for the disposing of the stress control layer SCF. However, in the case where the opening of the recessed area RA exists when the gasket pattern GP is disposed at the edges of the electronic panel EP and the optical sheet LS, the gasket pattern GP may not fill the opening of the recessed area RA, and a gap may be formed.

Figure 6E:
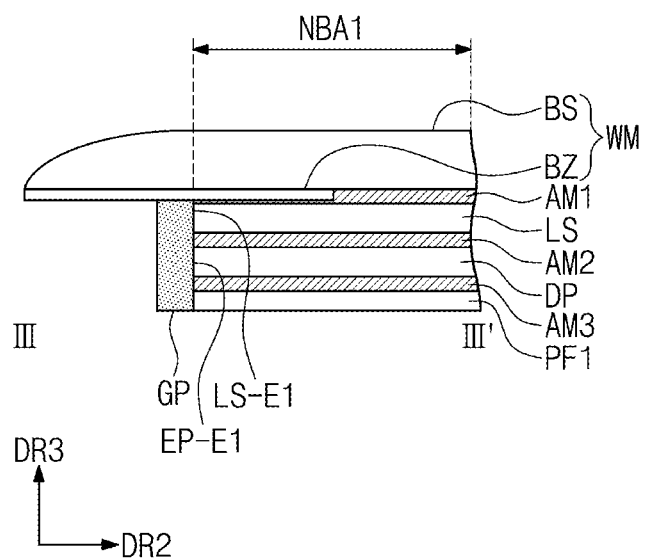
FIG. 6E is a cross-sectional view of an illustrative embodiment of the display device taken along a line III-III' of FIG. 5A.

FIG. 6E is a cross-sectional view of an illustrative embodiment of the display device taken along a line III-III' of FIG. 5A. Referring to FIG. 6E, the edges of the optical sheet LS and the electronic panel EP are aligned with each other. The first surface LS-E1 of the optical sheet LS and the first surface EP-E1 of the electronic panel EP may be aligned with each other. As a result, when liquid used to form the gasket pattern GP is coated on the edges of the optical sheet LS and the electronic panel EP, the first surface LS-E1 of the optical sheet LS and the first surface EP-E1 of the electronic panel EP may be covered. In FIG. 6E, the first surface LS-E1 of the optical sheet LS and the first surface EP-E1 of the electronic panel EP are aligned with each other, however, they should not be limited thereto or thereby. Cross-sectional shapes of the optical sheet LS and the electronic panel EP may be different from those of FIG. 6E unless an opening is formed between the electronic panel EP and the window WM. As an example, at least a portion of the optical sheet LS may protrude from the electronic panel EP toward the edge.

FIGS. 7A to 7E are schematic views of an illustrative embodiment of a method of coupling the electronic panel EP to the optical sheet LS shown in FIG. 3A.

Figure 7A:
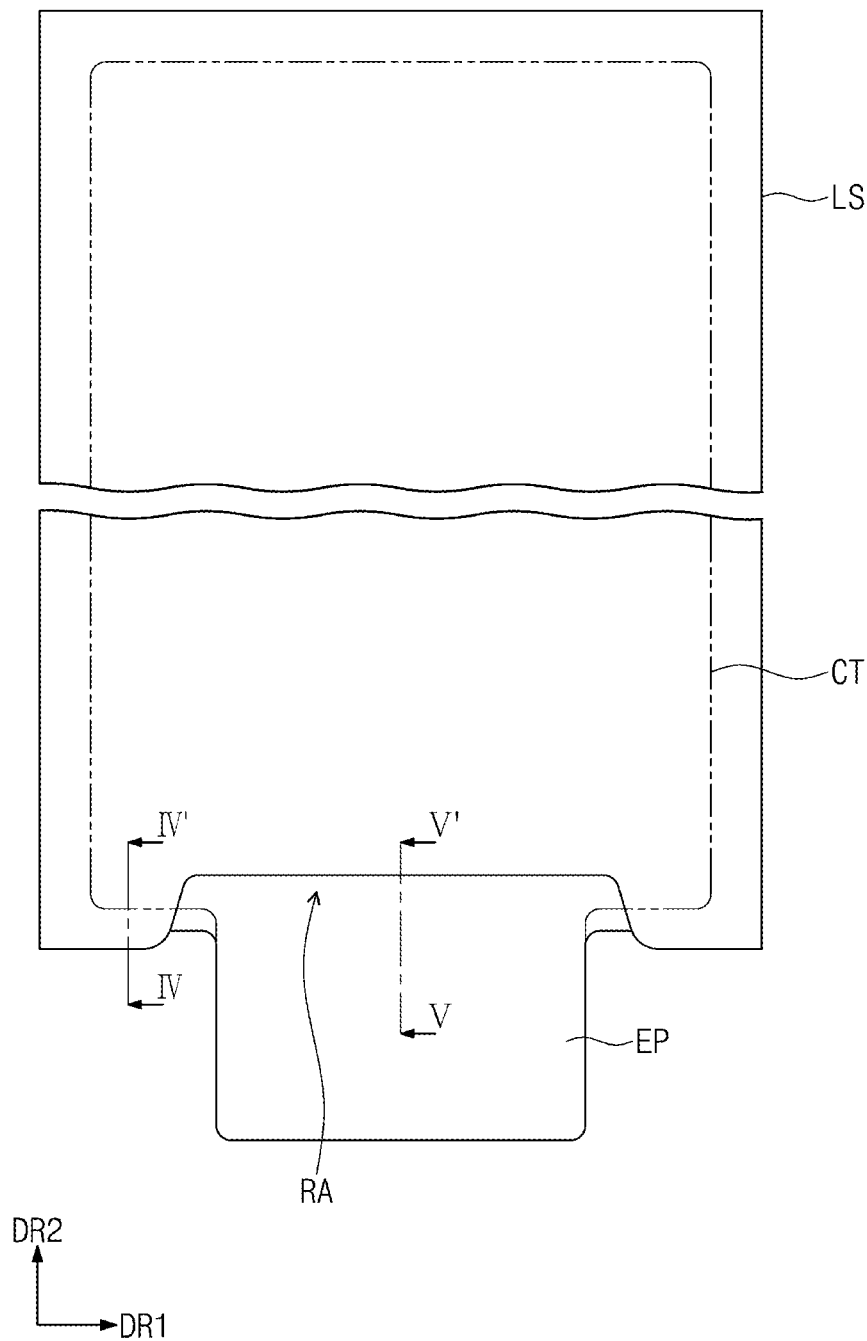
FIGS. 7A to 7E are schematic views of an illustrative embodiment of a method of coupling an electronic panel to the optical sheet shown in FIG. 3A.

FIG. 7A is a plan view explaining processes of attaching and cutting the electronic panel EP and the optical sheet LS. Referring to FIG. 7A, the optical sheet LS is disposed on the electronic panel EP before cutting. The recessed area RA may be defined in the optical sheet LS toward the center of the optical sheet LS when viewed in a plan view. The optical sheet LS has a recessed shape before the optical sheet LS is cut. That is, the optical sheet LS provided in the manufacturing process of the display device DD may be previously cut to have the recessed shape. This is because the optical sheet LS should not be cut to have the recessed shape when the optical sheet LS and the electronic panel EP are attached to each other. However, the edge of the optical sheet LS except for the recessed area RA may be cut together with the edge of the electronic panel EP.

First, the optical sheet LS having the recessed shape is attached to the electronic panel EP. Then, the edges of the optical sheet LS and the electronic panel EP, which are attached to each other, may be cut along a cutting line CT to correspond to an accommodating space of the electronic device ED of FIG. 1A.

Figure 7B:
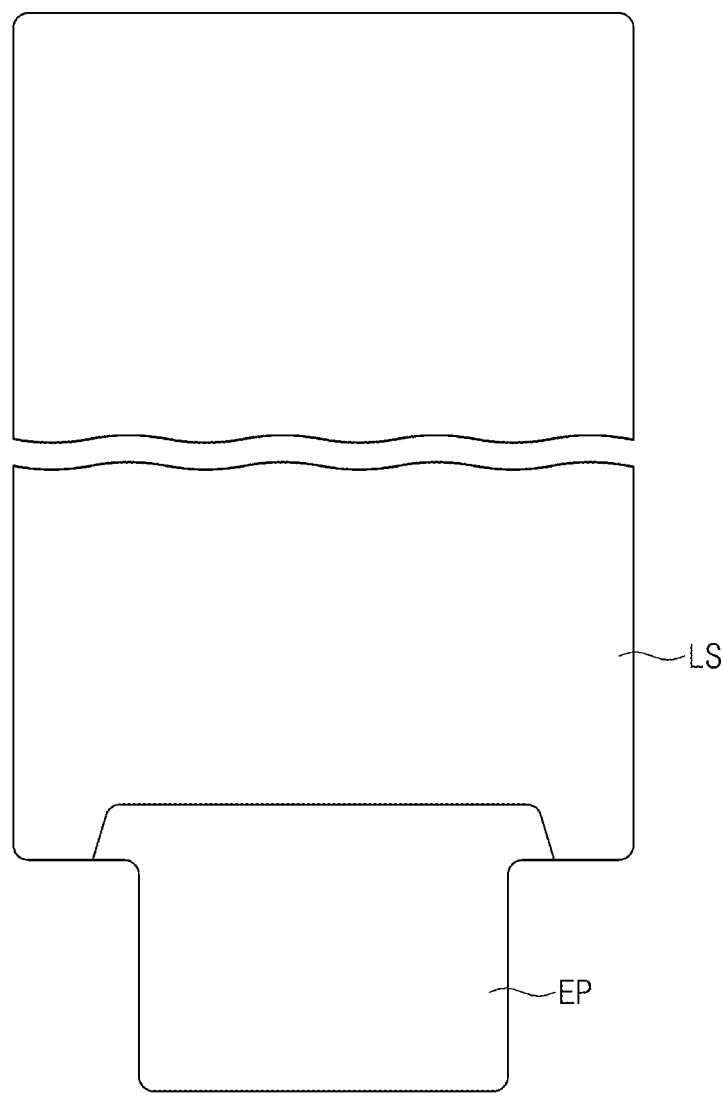

FIG. 7B is a plan view showing the electronic panel EP and the optical sheet LS after being cut. Referring to FIG. 7B, the edge of the optical sheet LS and the edge of the electronic panel EP may be aligned with each other as a result of cutting the electronic panel EP and the optical sheet LS. Accordingly, no step difference is formed between the optical sheet LS and the electronic panel EP in the area in which the gasket pattern GP is coated.

Figure 7C:
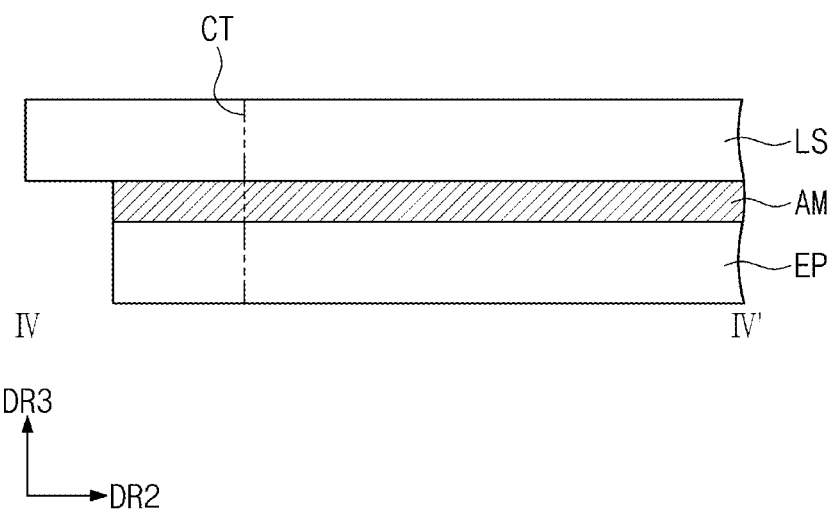
Figure 7D:
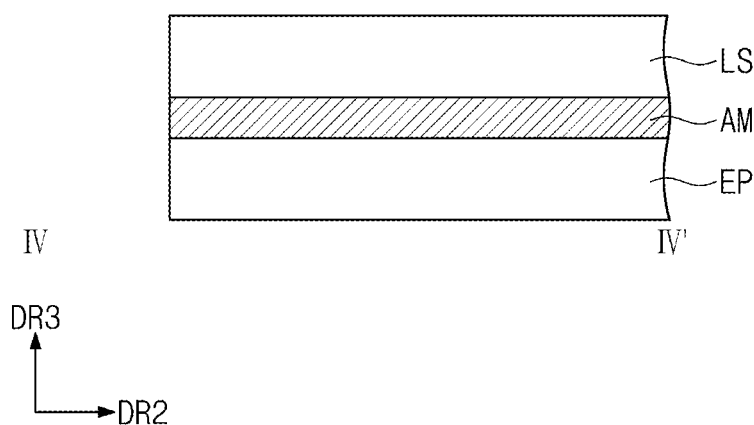

FIG. 7C is a cross-sectional view taken along a line IV-IV' of FIG. 7A before the electronic panel EP and the optical sheet LS are cut and FIG. 7D is a cross-sectional view taken along a line IV-IV' of FIG. 7A after the electronic panel EP and the optical sheet LS are cut. Referring to FIGS. 7C and 7D, the optical sheet LS may be coupled to the electronic panel EP by the adhesive member AM before the optical sheet LS and the electronic panel EP are cut. The electronic panel EP and the optical sheet LS may be cut together along the cutting line CT. As a result of the cutting process, the edges of the optical sheet LS and the electronic panel EP may be aligned with each other as shown in FIG. 7D. Therefore, when the above-described gasket pattern GP is coated, the gap may not be generated.

Figure 7E:
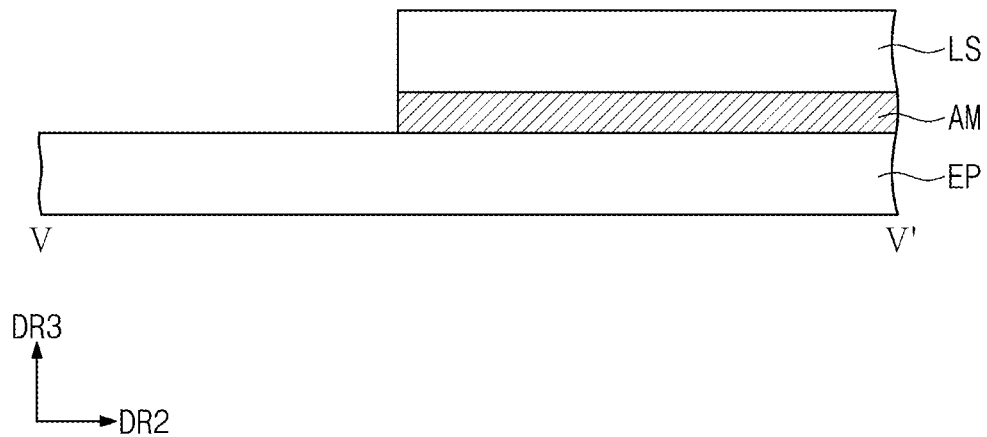

FIG. 7E is a cross-sectional view taken along a line V-V' of FIG. 7A. Referring to FIG. 7E, the optical sheet LS is disposed on the electronic panel EP after being previously cut to have the recessed shape. Thus, after the optical sheet LS and the electronic panel EP are attached to each other, a separate process procedure to create the space for receiving the above-described stress control layer SCF may not be required.

According to the above, the optical sheet is made by taking into account the arrangement of the stress control layer. Therefore, the non-display area or the bezel area may be reduced, and the stress of the display panel or the electronic panel due to the bending may be reduced.

In addition as the optical sheet is made in consideration of the arrangement of the gasket pattern, the gap may be reduced around the gasket pattern, and defects of the display device may be reduced.

Although certain illustrative embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel including a first non-bending area having a pixel area and a non-pixel area adjacent to the pixel area, a bending area extending from the first non-bending area, and a second non-bending area extending from the bending area and opposing the first non-bending area; and
   an optical sheet disposed on the display panel and having a recessed area defined therein extending toward a center of the optical sheet,
   wherein a portion of the non-pixel area overlaps the optical sheet, another portion of the non-pixel area overlaps the recessed area,
   the optical sheet has an edge aligned with an edge of the portion of the non-pixel area and another edge not aligned with an edge of the display panel, and
   the recessed area has a width greater than a width of the bending area in a first direction substantially parallel to a bending axis of the bending area.

2. The display device of claim 1, wherein the another edge of the optical sheet comprises an edge of the recessed area.

3. The display device of claim 1, wherein the another edge of the optical sheet is disposed inside the first non-bending area in a plan view.

4. The display device of claim 1, further comprising a stress control member coupled to the display panel and non-overlapping with the optical sheet in a plan view.

5. The display device of claim 4, wherein the stress control member overlaps with at least part of the recessed area, at least a portion of the bending area, and at least a portion of the second non-bending area, respectively.

6. The display device of claim 5, wherein the stress control member comprises a stress control layer that overlaps the first non-bending area overlapping the at least part of the recessed area and has a length of about 0.36 mm in a second direction extending to the bending area from the first non-bending area.

7. The display device of claim 4, wherein the optical sheet comprises:
   a first portion facing the stress control member in a second direction extending to the bending area from the first non-bending area;
   a second portion and a third portion facing each other in the first direction and each extending from the first portion in the second direction, and
   wherein the first portion, the second portion, and the third portion define the recessed area.

8. The display device of claim 7, further comprising a gasket pattern coupled to at least a portion of an edge of the second portion and a portion of the edge of the display panel aligned with the at least the portion of the edge of the second portion, and
   wherein the gasket pattern is disposed adjacent to the stress control member in the first direction.

9. The display device of claim 1, wherein, in the first direction, the width of the recessed area increases from the first non-bending area toward the bending area, and a minimum width of the recessed area is greater than the width of the bending area.

10. The display device of claim 1, further comprising a circuit board connected to the second non-bending area, wherein the recessed area is disposed between the pixel area of the first non-bending area and the circuit board in a plan view.

11. The display device of claim 1, further comprising:
    a first protective film overlapping with the first non-bending area and being disposed under the display panel; and
    a second protective film overlapping with the second non-bending area, being disposed under the display panel, and opposing the first protective film.

12. The display device of claim 11, wherein the first protective film has an edge not aligned with the edge of the optical sheet, which corresponds to the edge of the recessed area.

13. The display device of claim 1, further comprising an input sensor directly disposed on an upper surface of the display panel.

14. The display device of claim 1, wherein the optical sheet comprises a polarizer and a retarder.

15. The display device of claim 1, further comprising a window disposed on the optical sheet.

16. The display device of claim 14, wherein an opening is defined between the window and the display panel due to the recessed area.

17. The display device of claim 14, further comprising a gasket pattern coupled to at least a portion of the edge of the optical sheet and at least a portion of the edge of display panel overlapping the optical sheet, wherein the gasket pattern is coupled to at least a portion of a lower surface of the window that does not overlap with the optical sheet and the display panel.

18. A display device comprising:
    a display panel including a first non-bending area having a pixel area and a non-pixel area adjacent to the pixel area, a bending area extending from the first non-bending area, and a second non-bending area extending from the bending area and opposing the first non-bending area; and
    an optical sheet disposed on the display panel and having a recessed area defined therein extending toward a center of the optical sheet,
    wherein the optical sheet substantially entirely overlaps the first non-bending area in a plan view,
    an edge of the optical sheet defining the recessed area is disposed inside the non-pixel area in a plan view, and another edge of the optical sheet is aligned with a portion of an edge of the display panel.

19. The display device of claim 18, wherein the recessed area has a width greater than a width of the bending area in a direction substantially parallel to a bending axis of the bending area.

20. The display device of claim 18, further comprising a stress control member coupled to the display panel and non-overlapping with the optical sheet in a plan view.

21. The display device of claim 20, wherein the stress control member overlaps with at least part of the recessed area, at least a portion of the bending area, and at least a portion of the second non-bending area, respectively.

22. The display device of claim 20, the recessed area has a width greater than a width of the stress control member in a direction substantially parallel to a bending axis of the bending area.

23. A display device comprising:
- a display panel including a first non-bending area, a bending area extending from the first non-bending area, and a second non-bending area extending from the bending area and opposing the first non-bending area;
- an optical sheet disposed on the display panel, overlapping the first non-bending area, and having a recessed area exposing at least part of the first non-bending area;
- wherein the optical sheet has an edge aligned with an edge of the first non-bending area overlapping the optical sheet and another edge not aligned with the edge of the first non-bending area exposed by the recessed area.

* * * * *